United States Patent
El Zein et al.

(10) Patent No.: US 11,004,990 B2
(45) Date of Patent: May 11, 2021

(54) NANOMETER SIZED STRUCTURES GROWN BY PULSED LASER DEPOSITION

(71) Applicant: KING ABDULLAH UNIVERSITY OF SCIENCE AND TECHNOLOGY, Thuwal (SA)

(72) Inventors: Basma El Zein, Thuwal (SA); Yingbang Yao, Thuwal (SA); Elhadje Dogheche, Le Mont Houy (FR); Samir Boulfrad, Thuwal (SA); Ghassan Jabbour, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 170 days.

(21) Appl. No.: 14/439,655

(22) PCT Filed: Oct. 29, 2013

(86) PCT No.: PCT/IB2013/003096
§ 371 (c)(1),
(2) Date: Apr. 29, 2015

(87) PCT Pub. No.: WO2014/072829
PCT Pub. Date: May 15, 2014

(65) Prior Publication Data
US 2015/0280017 A1    Oct. 1, 2015

Related U.S. Application Data

(60) Provisional application No. 61/719,666, filed on Oct. 29, 2012.

(51) Int. Cl.
*B82Y 40/00* (2011.01)
*C30B 29/16* (2006.01)
(Continued)

(52) U.S. Cl.
CPC .......... *H01L 31/0296* (2013.01); *B82Y 40/00* (2013.01); *C01G 9/02* (2013.01);
(Continued)

(58) Field of Classification Search
CPC ......... H01L 31/0296; H01L 31/035281; H01L 29/0665; H01L 29/0676; H01L 31/1836;
(Continued)

(56) References Cited

U.S. PATENT DOCUMENTS

2008/0107876 A1*    5/2008    Yi .............................. C30B 7/10
                                                                    428/201
2008/0110494 A1*    5/2008    Reddy ............. H01L 31/035272
                                                                    136/255
(Continued)

FOREIGN PATENT DOCUMENTS

JP    2009532851 A    9/2009
JP    2010039004 A    2/2010
(Continued)

OTHER PUBLICATIONS

Premkumar et al, Optical and Field-Emission Properties of ZnO Nanostructures Deposited Using High-Pressure Pulsed Laser Deposition, Sep. 2010, ACS Appl. Mater. Interfaces, 2(10), 2863-2869.*
(Continued)

*Primary Examiner* — Andrew J Golden
(74) *Attorney, Agent, or Firm* — Patent Portfolio Builders PLLC

(57) ABSTRACT

Nanometer sized materials can be produced by exposing a target to a laser source to remove material from the target and deposit the removed material onto a surface of a substrate to grow a thin film in a vacuum chamber.

23 Claims, 32 Drawing Sheets

(51) Int. Cl.

| | |
|---|---|
| C23C 14/08 | (2006.01) |
| C23C 14/28 | (2006.01) |
| C30B 23/02 | (2006.01) |
| C30B 23/06 | (2006.01) |
| C23C 14/02 | (2006.01) |
| C30B 29/60 | (2006.01) |
| C01G 9/02 | (2006.01) |
| B82Y 20/00 | (2011.01) |
| B82Y 30/00 | (2011.01) |
| H01L 31/0296 | (2006.01) |
| H01L 31/18 | (2006.01) |
| H01L 31/0352 | (2006.01) |

(52) U.S. Cl.
CPC .......... *C23C 14/024* (2013.01); *C23C 14/086* (2013.01); *C23C 14/28* (2013.01); *C30B 23/02* (2013.01); *C30B 23/06* (2013.01); *C30B 29/16* (2013.01); *C30B 29/60* (2013.01); *H01L 31/1836* (2013.01); *B82Y 20/00* (2013.01); *B82Y 30/00* (2013.01); *H01L 31/035209* (2013.01); *Y10S 977/762* (2013.01); *Y10S 977/811* (2013.01); *Y10S 977/832* (2013.01); *Y10S 977/891* (2013.01); *Y10S 977/948* (2013.01); *Y10S 977/95* (2013.01); *Y10T 428/249921* (2015.04)

(58) Field of Classification Search
CPC ............. H01L 31/035209; C23C 14/28; C23C 14/086; C30B 29/16; C30B 29/60
USPC .................................................. 136/243–265
See application file for complete search history.

(56) References Cited

U.S. PATENT DOCUMENTS

| | | | | |
|---|---|---|---|---|
| 2008/0292808 | A1* | 11/2008 | Liu | C23C 14/086 427/554 |
| 2010/0098883 | A1 | 4/2010 | Ito | |
| 2011/0309354 | A1 | 12/2011 | Wang et al. | |

FOREIGN PATENT DOCUMENTS

| | | |
|---|---|---|
| JP | 2011051868 A | 3/2011 |
| WO | 2007098378 A1 | 8/2007 |

OTHER PUBLICATIONS

Willander et al Zinc oxide nanorod based photonic devices: recent progress in growth, light emitting diodes and lasers, Jul. 2009, Nanotechnology 20(33), 1-40.*
Chun et al, Effect of Seed Layer on Structural Properties of ZnO Nanorod Arrays Grown by Vapor-Phase Transport, 2008, J. Phys. Chem. C 112, 990-995.*
Chun et al, Synthesis and photoluminescence properties of vertically aligned ZnO nanorod-nanowall junction arrays on a ZnO-coated silicon substrate, Jun. 2006, Nanotechnology 17, 3740-3744.*
Sun et al, Optical properties of epitaxially grown zinc oxide films on sapphire by pulsed laser deposition, 1999, Journal of Applied Physics, 86, 408-411.*
International Search Report in related International Application No. PCT/IB2013/003096, dated Jun. 20, 2014.
Written Opinion of the International Searching Authority in related International Application No. PCT/IB2013/003096, dated Jun. 20, 2014.
B.Q. Cao et al., "ZnO Nanowalls Grown with High-Pressure PLD and Their Applications as Field Emitters and UV Detectors", Journal of Physical Chemistry C, Jun. 25, 2009, vol. 113, No. 25, pp. 10975-10980.
W.Z. Liu et al., "Size-Controlled Growth of ZnO Nanowires by Catalyst-Free High-Pressure Pulsed Laser Deposition and Their Optical Properties", AIP Advances, Jan. 2011, vol. 1, No. 2, pp. 022145-1-022145-8.
D. Nakamura et al., "Synthesis of ZnO Nanowire Heterostructures by Laser Ablation and Their Photoluminescence", Journal of Laser Micro-Nanoengineering, Jan. 2011, vol. 6, No. 1, pp. 23-25.
D.K.T. NG et al., "Synthesis of GaN Nanowires on Gold-Coated Substrates by Pulsed Laser Ablation", Current Applied Physics, Jun. 2006, vol. 6, No. 3, pp. 403-406.
Japanese Office Action in related Japanese Application No. 2015-538587, dated Sep. 12, 2017.
Kwok, H.S., et al., "Correlation Between Plasma Dynamics and Thin Film Properties in Pulsed Laser Deposition," App. Surf. Sci., 109-110, pp. 595-600, Feb. 1, 1997.

* cited by examiner a - 5 min b - 7 min c - 10 min d - 15 min a - ZnO NWs grown on Si Substrate b - ZnO NWs grown on Sapphire substrate c - ZnO Nws deposited on Si substrate - ZnO SL d - ZnO Nws deposited on Glass-ITO-ZnO SL a - Zno NWs Grown at 2.5 Torr b - ZnO NWs Grown at 5 Torr c - ZnO NWs Grown at 7.5 Torr d - ZnO NWs Grown at 10 Torr a - ZnO NWs interface with Seed layer b - Single ZnO NW c - FFT

NANOMETER SIZED STRUCTURES GROWN BY PULSED LASER DEPOSITION

CLAIM OF PRIORITY

This application claims the benefit under 35 USC 371 to International Application No. PCT/IB2013/03096, filed Oct. 29, 2013, which claims priority to U.S. Provisional Application No. 61/719,666, filed Oct. 29, 2012, each of which is incorporated by reference in its entirety.

TECHNICAL FIELD

The invention relates to nanometer sized structures grown by pulsed laser deposition, nanowires and nanowalls.

BACKGROUND

Materials at the nanoscale can have different properties because of increased relative surface area and quantum effects. Nanomaterials attract a lot of attention for their electronic, mechanical, optical, and chemical characteristics. Representative applications of nanomaterial-based devices are memory devices, light-emitting devices, display devices, photocatalysts, biosensors, and solar cells. Nanostructures can be created by different methods, such as mechanical grinding, wet chemical synthesis, gas-phase synthesis, sputtered plasma process, and laser ablation such as pulsed laser deposition which is a thin film deposition technique where a high power pulsed laser beam can be used to deposit materials on a substrate.

SUMMARY

In one aspect, nanometer sized materials can be produced by exposing a target to a laser source to remove material from the target and deposit the removed material onto a surface of a substrate to grow a thin film in a vacuum chamber at a pressure of between 10 mTorr and 500 mTorr. The vacuum chamber can be pumped down to a base pressure of about $10^{-6}$ Torr.

The thin film can include nanowalls, which can be grown in the presence of oxygen. The target can be zinc oxide. The thin film can be grown on different types of substrates, such as silicon wafer and glass optionally coated with a conductive layer such as ITO. The substrate can be cleaned ultrasonically. The substrate can be cleaned with an organic solvent, for example, acetone and isopropanol. The substrate can be dried with compressed gas. The target can be cleaned by ablating the surface of the target in the presence of a substrate-masked flag.

When growing the thin film, the temperature of the substrate can be between 400° C. and 650° C., preferably about 600° C., and the time of growth can range from 10 minutes to 45 minutes.

Importantly, during growth no catalyst and no template were present and no chemical etching steps were employed.

Parametric study have been conducted at different deposition times, oxygen pressures and substrate temperatures. The distance between the target and substrate is almost 9 cm.

Nanometer sized materials can be produced by exposing a target to a laser source to remove material from the target and deposit the removed material onto a surface of a substrate to grow a thin film as a seed layer and exposing a target to a laser source to remove material from the target and deposit the removed material onto the surface of the substrate to grow nanometer sized materials at a pressure of between 10 mTorr, and less than 50 mTorr. The vacuum chamber can be pumped down to a base pressure of $10^{-6}$ Torr.

The nanometer sized materials include nanowires. The target can be zinc oxide. The laser source can be KrF excimer laser. The substrate can be silicon, glass optionally coated with a conduct layer such as ITO, and sapphire. The substrate can be cleaned ultrasonically; the substrate can be cleaned with acetone and isopropanol; and the substrate can be dried by compressed gas. Nanowires can be grown at a pressure between 5 Torr and 10 Torr without any catalyst A zinc oxide seed layer can be deposited onto the substrate. Zinc oxide nanowalls can be grown as the seed layer. The zinc oxide seed layer can be grown at 600° C. in the presence of oxygen with a pressure of 10 mTorr. The nanometer sized materials can be grown at a temperature lower than 500° C. The nanometer sized materials can be grown in a background gas, and the background gas can be argon. The distance between the target and the source can be between 6.5 cm. and 5 cm and can depend on the PLD setup. For example, the working distance can be 6.5 cm.

A nanometer sized structure includes zinc oxide nanowalls that contain no catalyst. The nanowalls can be highly crystalline. A nanometer sized structure includes zinc oxide nanowires that contain no catalyst and are vertically oriented on a substrate. The nanometer sized materials can be highly crystalline.

A photovoltaic device includes a first electrode, a second electrode, and a nanometer sized structure having zinc oxide nanowalls that contain no catalyst. The nanowalls can be highly crystalline. A photovoltaic device includes a first electrode, a second electrode, and a nanometer sized structure having zinc oxide nanowires that contain no catalyst and are vertically oriented on a substrate. The nanometer sized materials can be highly crystalline.

The surface of a nanowire can include a nanoparticle, such as a lead sulfide nanoparticle. The surface of a zinc oxide nanowire can include a nanoparticle, which can be a lead sulfide nanoparticle. The nanowire that includes a nanoparticle on a surface of the nanowire can be used in a photovoltaic device, such as a solar cell.

Other aspects, embodiments, and features will be apparent from the following description, the drawings, and the claims.

DETAILED DESCRIPTION

Figure 1:
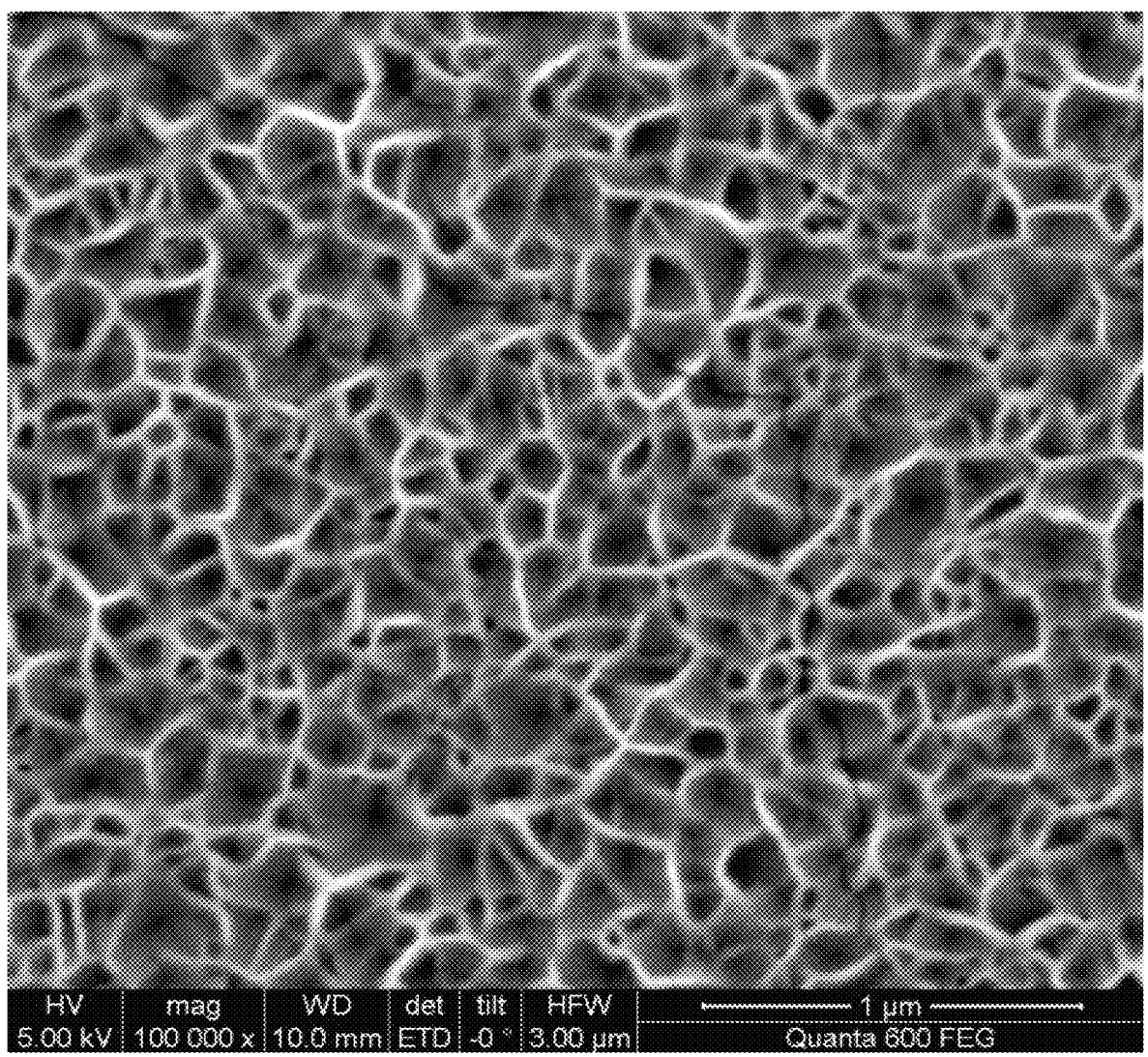
FIG. 1 is an SEM image of the top view of ZnO nanowall networks with honeycomb structure.

Nanotechnology is the manipulation of matter on an atomic and molecular scale. Nanotechnology is very diverse, ranging from extensions of conventional device physics to completely new approaches based upon molecular self-assembly, from developing new materials with dimensions on the nanoscale to direct control of matter on the atomic scale. Nanotechnology may be able to create many new materials and devices with a vast range of applications, such as in medicine, electronics, biomaterials and energy production.

Materials at the nanoscale can have different properties because of increased relative surface area and new quantum effects. Nanomaterials have a much greater surface area to volume ratio than their conventional forms, which can lead to greater chemical reactivity and affect their strength. Also at the nanoscale, quantum effects can become much more important in determining the materials properties and characteristics, leading to novel optical, electrical and magnetic behaviors.

Nanomaterials can be made of many different chemicals and compounds, including metal, metal oxide, semiconductor, carbon, composites, and dendrimers. Examples of metal based nanomaterials include nanogold or nanosilver. Carbon based nanomaterials are those that are mostly made of carbon. Composites are nanomaterials combined with large bulky materials or other nanoparticles. A dendrimer is a type of nanomaterial made of polymer that contains many branches. Metal oxide nanomaterials can be zinc oxide, titanium oxide, indium tin oxide iron oxide, or other binary or tertiary oxides.

Nanostructures can be created by different methods, such as mechanical grinding, wet chemical synthesis, gas-phase synthesis, sputtered plasma process, and laser ablation. Mechanical attrition is an example of top down method of synthesis of nanomaterials, where the material is prepared not by cluster assembly but by the structural decomposition of coarser-grained structures as the result of severe plastic deformation. Wet chemical synthesis can produce nanomaterials by mixing materials containing desired precursors in a controlled environment to form a colloidal solution. Chemical Vapor Deposition, a gas-phase synthesis method, delivers precursor gases (often diluted in carrier gases) into a reaction chamber, and as the precursor gases pass over or come into contact with a heated substrate, they react or decompose forming a solid phase deposited onto the substrate to product nanostructures. Laser ablation uses a laser beam as the primary excitation source of ablation for generating clusters directly from a solid sample and can be used to form nanostructures.

Pulsed laser deposition (PLD) is a deposition technique where a target is exposed to a laser source to remove material from the target and deposit the removed material onto a surface of a substrate. This material is vaporized from the target which deposits it as a thin film on a substrate. This process can occur in ultrahigh vacuum or in the presence of a background gas, such as oxygen or argon. PLD technique is a powerful technique that can produce high quality epitaxial oxide thin films at low temperature. It is also used to produce various nanostructures like nanowires, nanoparticles, and nanowalls.

PLD involves laser ablation and evaporation of a target material by a high power laser. The ablated material forms a plume comprising both undesirable large particles and desirable atoms and ions which all get deposited on a substrate. More specifically, the plume includes ions, electrons, atom clusters, and larger particulates of varying sizes. The plume extends from the target in a direction outward from the target. Often, the substrate is positioned so that it is directly in front of the target, at a distance of a few inches.

Thus, the plume spreads onto the substrate to form the thin film. In this arrangement, the direct plume has a range of atom clusters and particulate sizes. The substrate may also be placed alongside the plume to collect a greater percentage of atomic species but at a lower deposition rate.

The PLD method offers many advantages over other types of techniques for forming a thin film on a substrate. For example, the PLD method offers ease of deposition and the formation of crystalline films with good adhesion at low temperatures, even as low as room temperature. Another advantage of the PLD technique is the ability to reproduce the stoichiometry of the target in the film, including that of the multi-component targets. PLD is desirable for routine deposition at room or higher temperatures providing high quality crystalline thin films. PLD is an excellent method for use in superconductor film growth processes and other coating processes for forming high quality thin films.

The deposition techniques and their deposition parameters play an important role in controlling the morphology and physical properties of the nanostructures. Different types of substrates can be used for PLD process. The growth of thin films by PLD on different substrates follows different mechanisms. Substrates include silicon wafer, sapphire, glass optionally coated with a conductive layer, sapphire, quartz, and the like. Thin films can be prepared by PLD technique with varying pressure during growth, varying growth time, and varying substrate temperature.

The temperature effect is related to the surface diffusion; a high temperature can provide sufficient energy for deposited species and make them migrate to low energy sites for growth. The gas pressure influences both the deposition rate and the kinetic energy of ejected particles. The size of the ablated plume decreases when increasing the gas pressure. In PLD, the introduction of gas within the deposition chamber causes a decrease in the kinetic energy of the ejected particles due to plasma confinement by surrounding gas.

One-Dimensional Nanometer Sized Structures

Nanostructure, a basic material for manufacturing nanoscale devices or quantum devices, can be divided into three categories, i.e. a zero-dimensional quantum dot, a one-dimensional quantum line (or nano-line) and a two-dimensional quantum well. When the length of a one-dimensional nanostructure is large than its width, the one-dimensional nanostructure is called nanowire (NW), nanopillar or nanopost. The length of a nanowire can range from 1 nanometer to 1000 nanometers.

One-dimensional nanometer sized material attracts lots of attention due to their promising role for photovoltaic devices with respect to several performances and processing benefits, such as direct path for charge transport and large surface areas for light harvest offered by the geometry of these nanostructures. There is also a large possibility that one-dimensional nanostructures can be applied as materials for optically functional devices, interconnection wires and transistors.

In order to manufacture devices using one-dimensional nanostructures, patterning of the one-dimensional nanostructures can be used. Patterning techniques are often focused on patterning a metal catalyst on a substrate, followed by growing a nanostructure formed on the patterned metal catalyst. Catalyst is a substance that increases the rate of a chemical reaction without itself undergoing any permanent chemical change. For example, depositing a metal catalyst on a selected region through a shadow mask can form a pattern of a metal catalyst. Using this method, however, it is difficult to achieve a resolution of 100 μm or less, and high resolution is required by high integration of circuits and compactness of devices. Without using the patenting technique, PLD can grow one-dimensional nanostructures at different pressures, for different periods of time, and at different temperatures.

Nanowalls

Nanowall is defined as a two-dimensional nanostructure which typically has a wall like structure rising upwards from a base material or the surface of a substrate and may be single- or multi-walled. The term "two-dimensional" means that the longitudinal length and lateral length of a face of the nanostructure are sufficiently greater than the thickness of the nanostructure. "Highly crystalline" means that the one-dimensional nanostructures or the two-dimensional nanostructures maintain the distinct crystal structure of the material. When nanowalls connect with each other, they form nanowall network. The length and width of a nanowall range from 10 to 1000 nanometers, and the thickness of a nanowall ranges from 2 to 500 nanometers.

Carbon nanowalls, two-dimensional "graphitic" platelets that are typically oriented vertically on a substrate, can exhibit similar properties as graphene. Carbon nanowalls can be grown using direct current plasma-enhanced chemical vapor deposition. Carbon nanowalls can grow on silicon, stainless steel, and copper substrates. Another type of nanowall, ceramic A14C3 nanowall, can also be fabricated through a chemical vapor deposition method.

Compared with one-dimensional nanostructure, nanowall is novel two-dimensional nanostructures that hold promise in photo catalysts, biosensors, solar cells, and other fields demanding higher surface to volume ratio, as well as templates for growth of other types of nano materials like nanowires. Fabrication methods for nanowalls include vapor liquid solid and metal organic chemical vapor deposition with metal catalyst which can be a source of contamination affecting their properties.

PLD can also be employed to fabricate nanowalls. Zinc oxide (ZnO) nanowalls can be grown by simple and straight forward PLD technique without the use of any catalyst or using chemical etching which might affect the electrical and optical properties of the ZnO Nanowall.

Advantages of ZnO Nanostructures

ZnO is a very attractive material for applications in optical devices such as blue-violet and ultraviolet light emitting diodes laser diodes and solar cells, owing to its direct and wide band gap (~3.3 eV), large exciton binding energy (~60 mev) and thermal energy sufficiently higher than that at room temperature (~27 eV). Invisible thin film transistors using ZnO as an active channel can achieve much higher field effect mobility than amorphous silicon thin film transistors. These transistors can be widely used for display applications. ZnO has been proposed to be a more promising UV emitting phosphor than GaN because of its larger exciton binding energy (60 meV). This leads to a reduced UV lasing threshold and yields higher UV emitting efficiency at room temperature. Surface acoustic wave filters using ZnO films can be used for video and radio frequency circuits. Piezoelectric ZnO thin film can be fabricated into ultrasonic transducer arrays operating at 100 MHz. In addition, ZnO is inexpensive and non-toxic.

Based on these remarkable physical properties and the motivation of device miniaturization, attention has been given to low dimensional ZnO nanostructures like zero-dimensional such as quantum dots, and one-dimensional nanowires. The existence of various forms of ZnO nanostructures opened opportunities for applications not only to energy harvesting but also to optoelectronics and photovoltaics.

Using PLD, catalyst free ZnO nanostructures can be synthesized by various methods such as catalytic growth via the vapor liquid solid mechanism, thermal evaporation, pulsed laser deposition, hydrothermal growth and the wet chemical processing. ZnO nanowalls can be grown by PLD at different pressure and temperature with different period of time. ZnO nanowall networks can be employed as a seed layer (SL) to initiate and guide the orientation of the growth of nanowires without using any other metal catalyst. Vertically aligned ZnO nanowires can be grown by PLD on textured seed layer at high background pressure without using any metal catalyst.

ZnO nanowall is a novel two-dimensional nanostructure that holds promise in photo catalysts, biosensors, solar cells, and other fields demanding higher surface to volume ratio, as well as templates for growth of other types of nano materials like nanowires. In addition, nanowalls can be used as a potential field emission material, the high surface area of nanowalls can be ideal for catalyst support, and nanowalls can be used in batteries and electrochemical capacitors. In addition, nanowalls can also be used as a template for loading other nanomaterials and the resulting hybrid nanostructures are potentially useful for various applications.

Photovoltaic Devices with Nanometer Sized Structures

Nano devices or quantum devices draw attention as the most promising devices available for device miniaturization, and are recognized as next generation devices in terms of their size effects, high efficiency, low power consumption and excellent thermal stability. Representative applications of nano devices are memory devices, light-emitting/-receiving optically functional devices for optical communication and optical memory, display devices and the like.

The nanowire (NW) geometry provides potential advantages over planar wafer-based or thin-film solar cells in the photo conversion process. These advantages include reduced reflection, extreme light trapping, improved band gap tuning, facile strain relaxation, and increased defect tolerance. These benefits reduce the quantity and quality of material necessary to approach the maximum efficiency, allowing for substantial cost reductions. Additionally, nanowires provide opportunities to fabricate complex single-crystalline semiconductor devices directly on low-cost substrates and electrodes.

Compared with one-dimensional nanostructure, nanowall is novel two-dimensional nanostructures that hold promise in photo catalysts, biosensors, solar cells, and other fields demanding higher surface to volume ratio, as well as templates for growth of other types of nano materials like nanowires. The nanowall textured solar cell can be more effective in reducing the overall optical reflectance, resulting in higher short circuit current over nanowire structured and planar solar cells. ZnO nanowalls can be used in energy storage devices, chemical and biological sensors and solar cells, because of its surface area that is much larger than that in thin films.

Nanostructure Based Solar Cell Device

Figure 28:
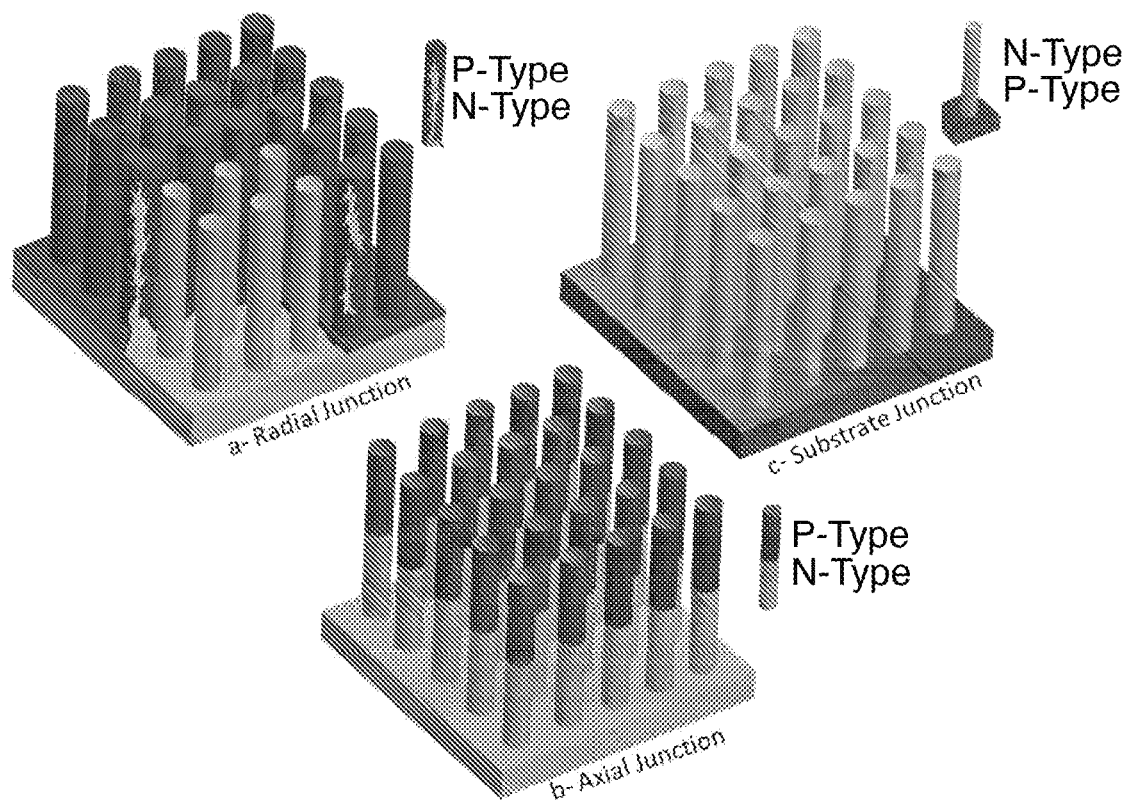
FIG. 28 shows schematics of nanowire arrays benefits for solar cells: a) radial hetero-structure, b) axial homo-junction, and c) substrate hetero-structure.

Nanowire based solar cells have some possible benefits over traditional thin-film devices due to optical, electrical, and strain relaxation effects; new charge separation mechanisms; and cost. Thus, the ordered arrays of vertical nanowires with radial junctions showed to prove these effects (FIG. 28). Electron hole pairs are generated differently within semiconductor under light illumination based on the geometry of the Photovoltaic devices. There can be three different geometries: axial, radial and substrate junctions.

In axial structure, usually considered as homo-junction, the electron hole pairs are generated within the semiconductor and the carriers are separated where the electron and hole migrate in the opposite directions towards the two ends of the NWs. The hetero-junction in a radial structure extends the interface along the surface of the NWs, resulting in a short carrier diffusion range and large interface for efficient carrier separation and transport. On the other hand, in the substrate junction, the interface is extended on the cross section of the NWs which shorten the carrier diffusion range to the diameter of the NWs.

Bulk recombination in radial junction is largely suppressed due to the large junction area and short diffusion length compared to the axial and substrate junctions. Radial Junctions can be selected. Excitonic Solar Cells are considered as promising inexpensive Solar Cell type. The solar to electric energy processes are separated into different materials that comprise the solar cell. This separation allows the cell to operate as a majority carrier device where the electrons transport through electron rich materials and the holes transport through hole rich materials. The Chemical potential difference across the cell is the main driving force separation that leads to the photovoltaic effect. Nanowires of wide band gap semiconductors such as $TiO_2$ and ZnO find applications in a variety of Excitonic Solar Cells as the electron acceptor and conductor. The Effective use of Nanowires require the ability to control and tailor their dimensions and morphology (height, diameter, spacing and planar density).

Size and morphology dependent properties such as quantum confinement effects in semiconductor nanostructures provide a rational approach toward a highly efficient solar energy conversion process. See, for example, A. Kudo, *MRS Bull.*, 2011, 36, 32-38, which is incorporated by reference in its entirety. The optical absorption properties and band gap of QDs can be tuned for efficient harvest of the entire solar spectrum. Significant efforts have been placed on the application of QDs in PV devices in which the photo-generated electrons and holes are transported to external circuits. See, for example, A. Franceschetti, *MRS Bull.*, 2011, 36, 192-197; A. I. Hochbaum and P. Yang, *Chem. Rev.*, 2010, 110, 527-546; K. Q. Pena and S. T. Lee, *Adv. Mater.*, 2011, 23, 198-215; E. H. Sargent, Nat. Photonics, 2009, 3, 325-331, each of which is incorporated by reference in its entirety.

Zero dimensional (0D) and one dimensional (1D) nanostructures have attracted good attention owing to their unique physical and chemical properties in solar energy harvesting, conversion and storage. See, for example, P. Yang, R. Yan and M. Fardy, *Nano Lett.*, 2010, 10, 1529-1536, which is incorporated by reference in its entirety. Quantum Dots, 0D nanostructures, with their tunable band gap and optical properties to harvest the entire solar spectrum, can improve the optical absorption, charge generation, but limited by the lack of mechanism for effective charge separation and transportation. See, for example, Minsu Seol, Easwaramoorthi Ramasamy, Jinwoo Lee, and Kijung Yong *J. Phys. Chem. C* 2011, 115, 22018-22024, which is incorporated by reference in its entirety. On the other hand Nanowires (NWs), 1D nanostructure, provide the charge separation and transportation. See, for example, P. Yang, R.

Figure 29:
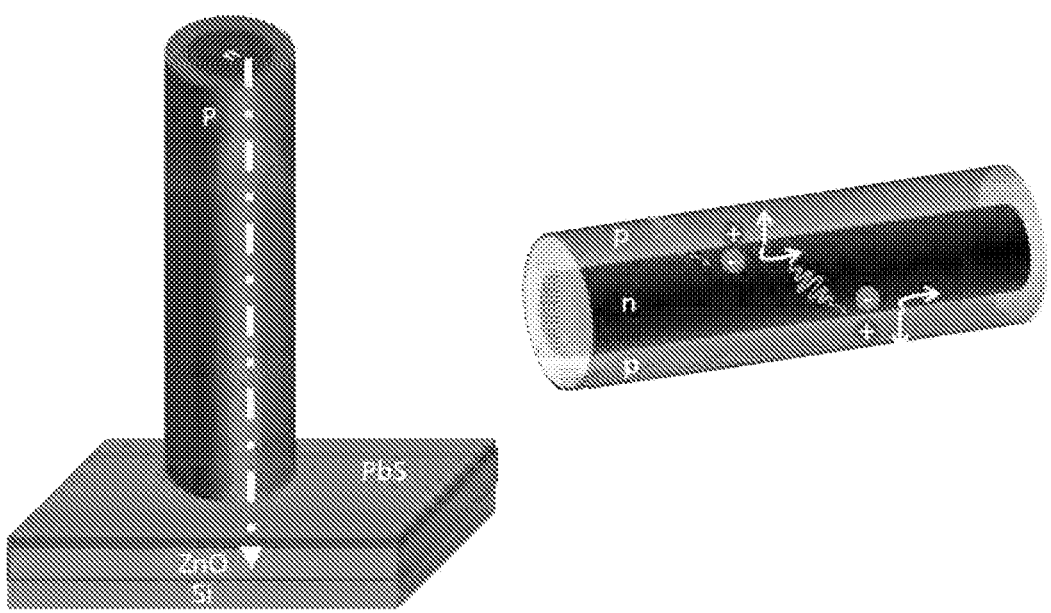
FIG. 29 is a schematic illustrating radial junction based on ZnO NWs with PbS NPs.

Yan and M. Fardy, *Nano Lett,* 2010, 10, 1529-1536, which is incorporated by reference in its entirety. Driven by these unique properties, ZnO NWs and PbS QDs can be combined together to form the hybrid radial junction solar cell (FIG. 29). The radial structure can extend the hetero-junction interface along the surface of the NWs resulting in a short carrier diffusion range and a large interface for efficient carrier separation and transport. Due to the large junction area and short diffusion length, the recombination of charge carriers is suspended.

Figure 30:
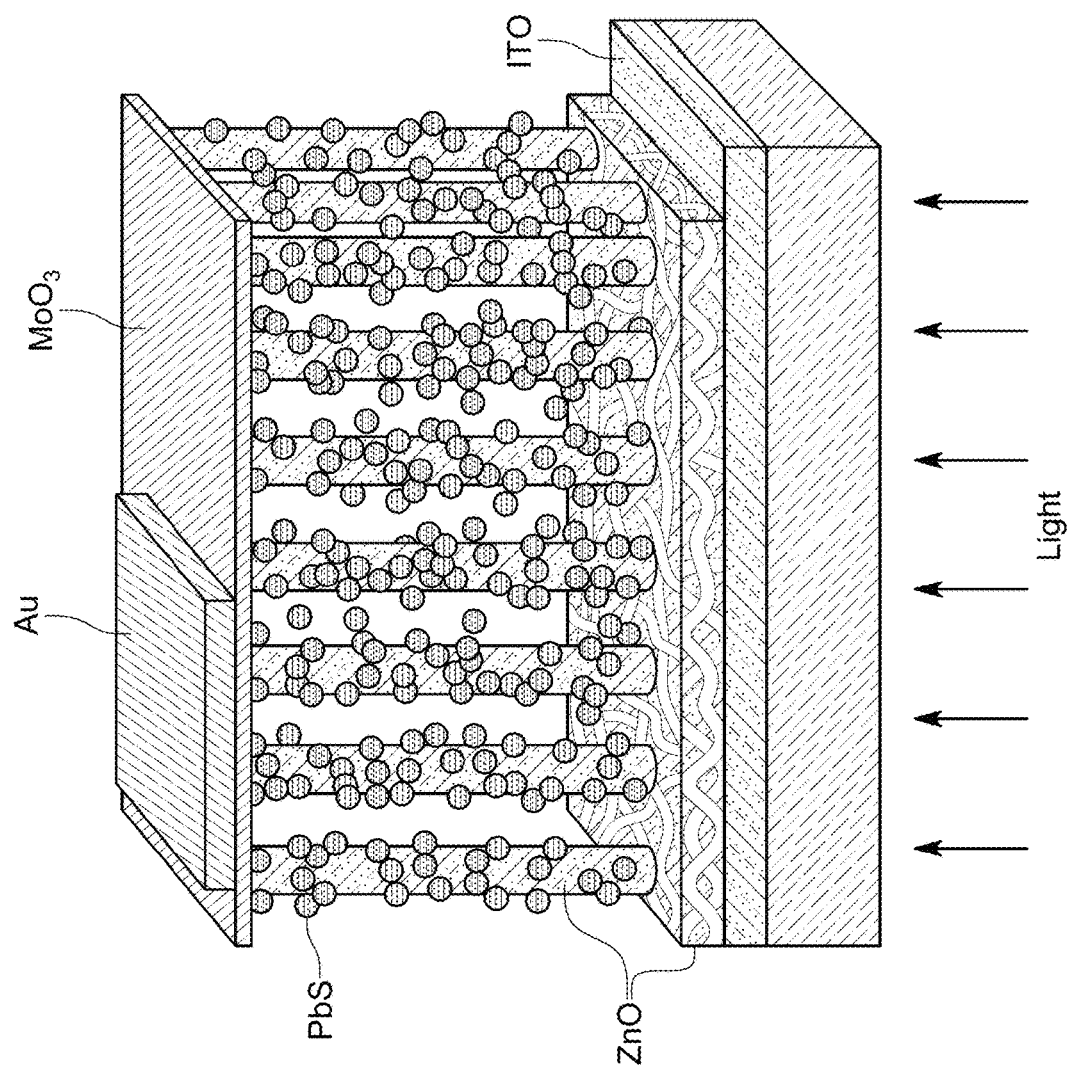
FIG. 30 is a schematic showing an example of a solar cell based on ZnO nanowires.

One of the applications of ZnO Nanowires is the solar cells with the radial junction. FIG. 30 presents an designed architecture of a solar cell based on ZnO nanowires with some Quantum dots decorating the lateral and top sides of the ZnO Nanowires.

Figure 31:
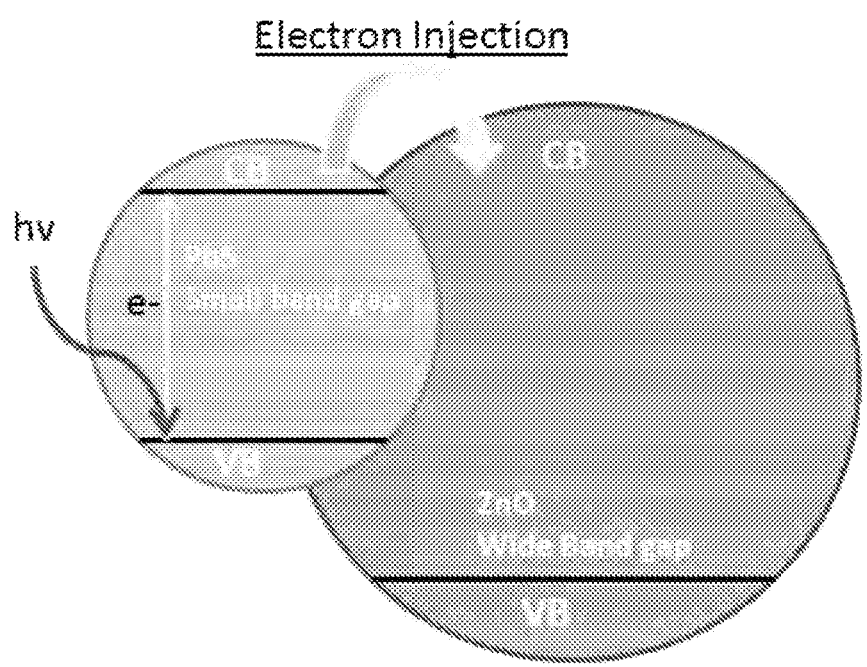
FIG. 31 is a schematic showing charge injection from excited semiconductor nanocrystal PbS into ZnO NPs in the operation of a quantum dot sensitized solar cell.

The primary photochemical event leading to photocurrent generation in QDSCs is the charge separation at the metal chalcogenide-metal oxide interface. It's been demonstrated that the charge separation in CdS—ZnO and CdS—$TiO_2$ coupled semiconductor has been improved. See, for example, L. Spanhel, H. Weller, A. Henglein, *J. Am. Chem. Soc.* 109 (1987) 6632, which is incorporated by reference in its entirety. FIG. 31 shows an example of a type of semiconductors assembly that can be designed. The matching of the band energies of two semiconductors facilitates the desired function to induce electron-hole recombination for a LED or improve charge separation by driving electrons and holes in two different nanoparticles for a Solar Cell. The QD must first absorb a photon, placing it in an electronically excited state QD+hυ→QD*(1).

Shortly after the absorption, the electron and hole relax to their most energetically favorable states, namely the conduction and valence band edges, respectively, creating an electron-hole pair QD*→QD($e^-$+$h^+$) (2). In order to harvest the potential energy of this electron-hole pair through an external load, the electron and hole must be separated spatially. This is achieved through the electron transfer depicted in QD ($e^-$+$h^+$)+ZnO→QD($h^+$)+ZnO($e^-$) (3) whereby an electron moves from the QD conduction band to the ZnO conduction band.

There are two other potential fates of the electron-hole pair: non-radiative QD($e^-$+$h^+$)→QD+Heat (3') and radiative QD($e^-$+$h^+$)→QD+hυ (3") recombination. Once spatially separated from the photo-generated hole, the electron must then navigate the ZnO scaffold (4) ZnO($e^-$)→ ZnO($e^-$)$_{nearest\ neighbor}$ (4). Once at the working electrode surface, the electron must transfer to the circuit at the working electrode ZnO($e^-$)+electrode→ZnO+electrode ($e^-$) (5) Meanwhile, the photo-generated hole remaining in the QD valence band is scavenged by the electrolyte species QD($h^+$)+electrode→QD+electrode ($h^+$) (6), which then needs to diffuse spatially away from the QD layer and to the counter electrode. See, for example, Prashant V. Kamat, *Acc. Chem. Res.*, (2012) 10.1021/ar200315d, which is incorporated by reference in its entirety.

Figure 32:
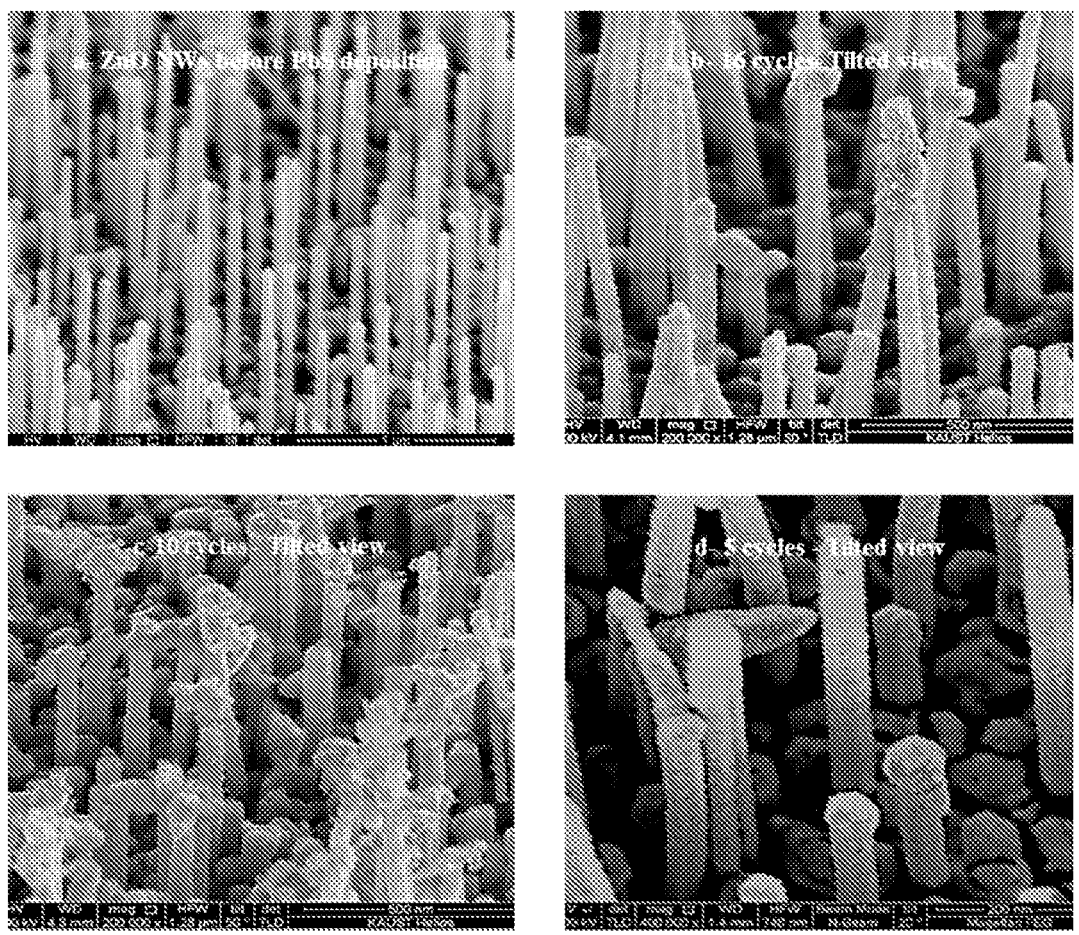
FIG. 32 shows ZnO nanowires decorated with PbS quantum dots with different concentrations.

FIG. 32 shows images of quantum dots attached to ZnO nanowires with different densities.

EXAMPLES

Pulsed Laser Deposition

PLD utilizes the energy of a focused laser beam incident on a material target in a vacuum chamber. It is fast, clean, environmentally friendly, and compatible with most of inorganic materials, such as metals, oxides, etc. A kryton fluoride (Krf) laser system can be used to deposit ZnO onto a substrate.

Growth of ZnO Nanowalls Using PLD

A kryton fluoride (KrF) laser system (λ=248 nm, 15 ns, 10 Hz and 500 mJ per pulse) was used in this experiment. The laser beam was focused by focal lens on to a ZnO target for around 8 J·$cm^{-2}$. The purity of the pressed powder ZnO target used was 99.9%.

ZnO films were produced in a vacuum chamber pumped down to a base pressure of $10^{-6}$ Torr. The substrates were (100) Si P-Type wafers pre-diced into 1.5 $cm^2$ pieces and positioned around 10 cm from the target surface. The substrate surface was oriented almost normal to the target surface. Before starting deposition, the target surface was ablated with the substrate-masked flag to clean the target surface of possible environment contaminants.

To have a better understanding of the growth of the nanowall network (NWaN), different deposition took place for different deposition durations of time, at different pressures, and at different substrate temperatures. The thin film was deposited first at different period of time ranging from 45 minutes ("min") to 5 min, in oxygen environment of 10 mTorr after heating the substrate to 600° C. with a rate of 30° C. per minute. Then it was deposited at different oxygen pressures ranging from 10 mTorr to 500 mTorr at 600° C., and at different substrate temperatures ranging from 500° C. to room temperature (RT).

Figure 2:
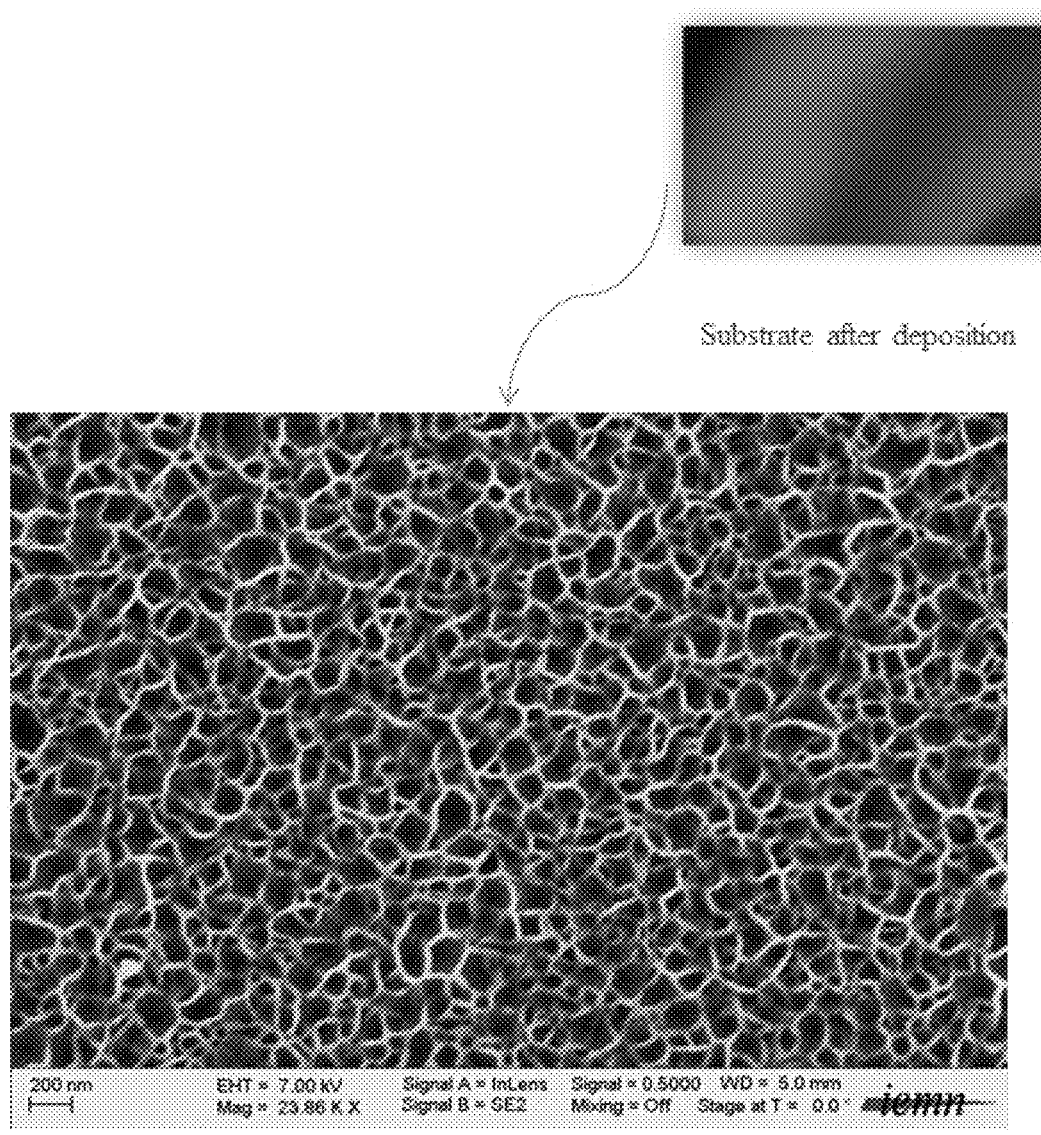
FIG. 2 is an SEM image of ZnO nanowall networks with honeycomb structure and a picture of the substrate that shows different colors.

FIG. 1 is a scanning electron microscope (SEM) top view of the ZnO nanowall with honeycomb structure grown on Si(100) substrate at 600° C. at an oxygen pressure of 10 mTorr. A high porous surface of ZnO film is revealed by the SEM image in FIG. 1. No catalyst or chemical etching was employed to the growth of the nanowall structure with honeycomb structure. The nanowalls can be grown directly on different types of substrates, including Si(100) and glass coated with indium tin oxide (ITO). FIG. 2 is another SEM image of ZnO NWaN with honeycomb structure and FIG. 2 also shows a colorful picture of the substrate.

Figure 3:
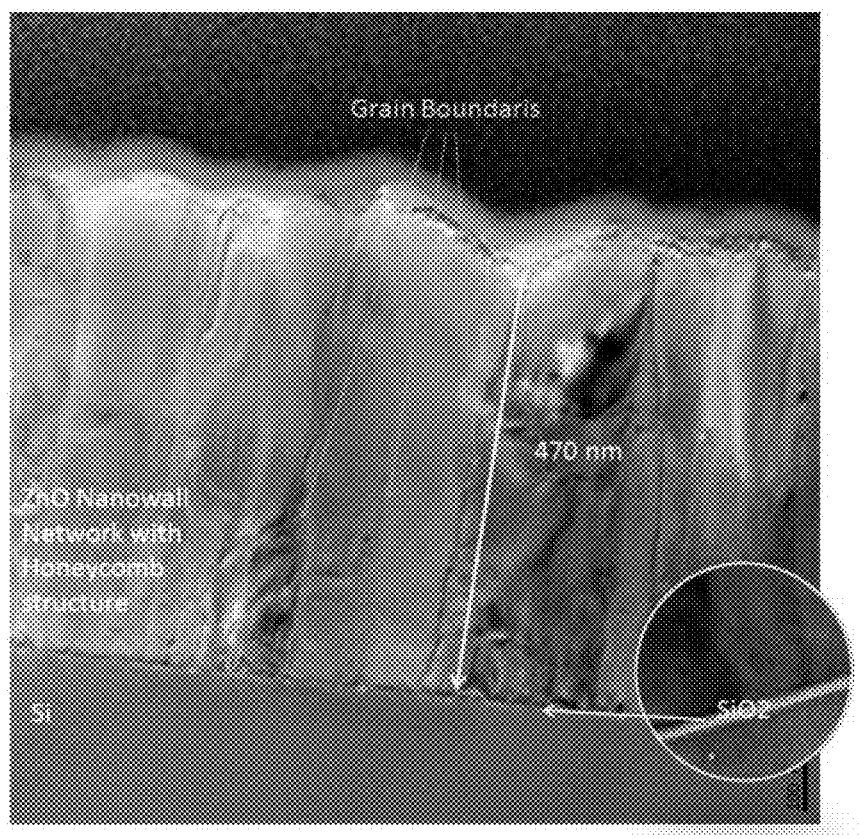
FIG. 3 is a TEM image of ZnO nanowalls with honeycomb structure.

The crystallography of ZnO NWaN was further investigated using TEM. FIG. 3 is a cross section image of the ZnO film. The orientation can be revealed by the image. TEM results suggest single crystal ZnO NWaN was grown with c-axis orientation with a thickness of 470 nm. Only few crystal defects such as dislocations and stacking faults were observed. An HRTEM image shows the continuous ZnO crystal lattice across the film. The grains were grown perpendicular to the substrates even though they were deposited on Si (100) substrates. Grain size forming the columnar structure seems to be similar to each other in the range of 90-120 nm.

Figure 4:
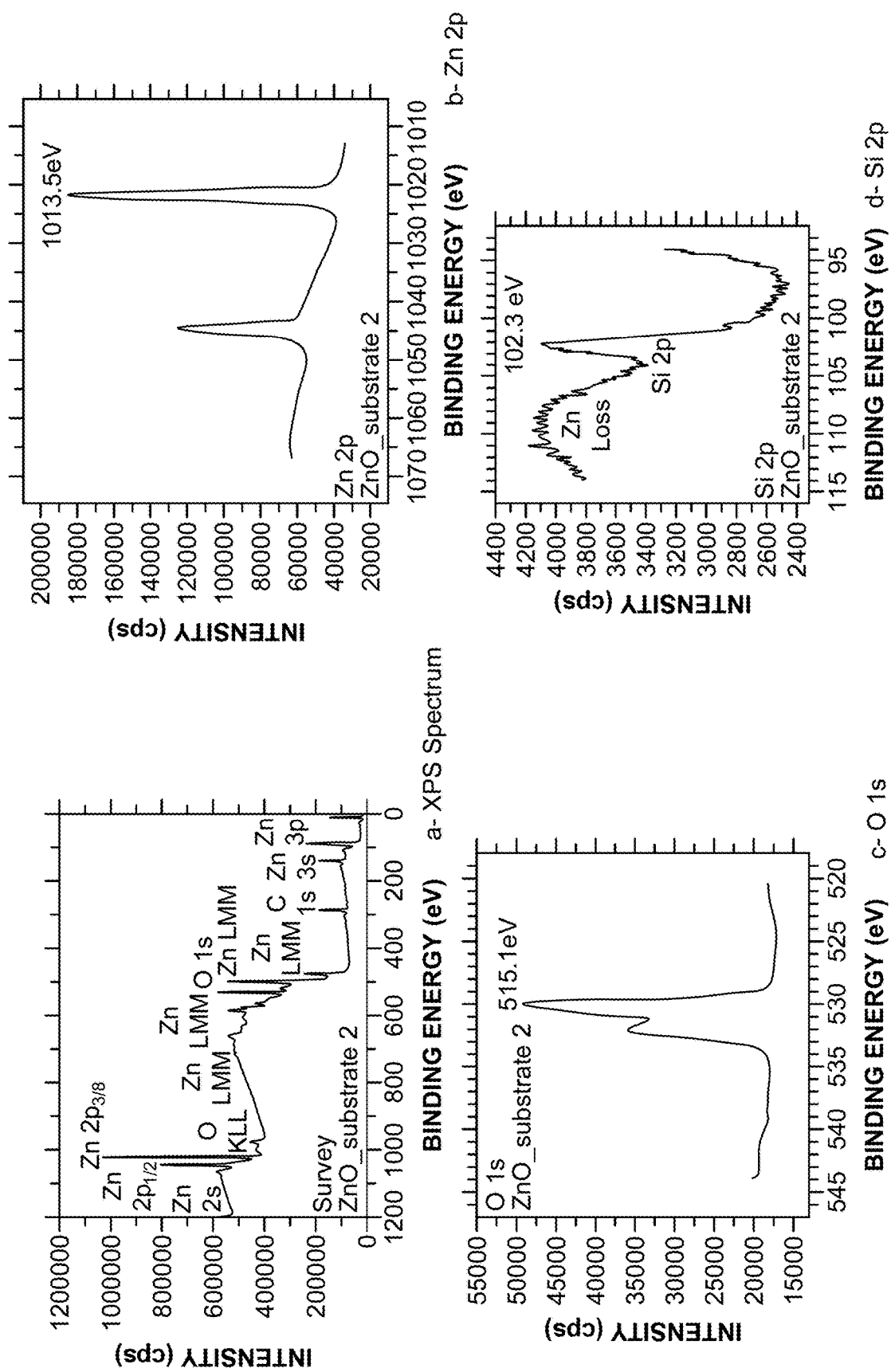
FIG. 4 is a series of KPS measurements for ZnO nanowall networks with honeycomb structure.

FIG. 4 presents XPS spectra of a ZnO NWaN with honeycomb structure. The XPS spectra indicate the presence of the elements of Zn, O, C and Si. No contaminations were detected on the sample surface. The XPS spectrum of the Zn-2p is presented in FIG. 4*b* and O-1s is presented in FIG. 4*c*. The ZnO NWaN with honeycomb structure exhibits an asymmetric peak at 530.1 eV observed in O1-s core level spectrum of FIG. 4*c*. FIG. 4*d* reveals an intense peak at 102.3 eV which corresponds to $Si_{2p}$. It is noticed that Si element can be identified in the ZnO NWaN, which might be caused by the porosity of the nanowall. The ratio of Zn2p to O1s is around 1.14 which reflects the high quality of ZnO NWaN deposited in oxygen environment.

Many parameters, such as substrate to target distance, background oxygen pressure and the substrate temperature, influence the nanostructures deposited by PLD and their quality. Substrate temperature is typically lower than the setting temperature. Parametric study was conducted to understand the growth mechanism of the ZnO nanowall with honeycomb structure at different pressures, at different temperatures, and at different deposition times.

Effect of Deposition Time on the Growth of ZnO Nanowalls

Figure 5:
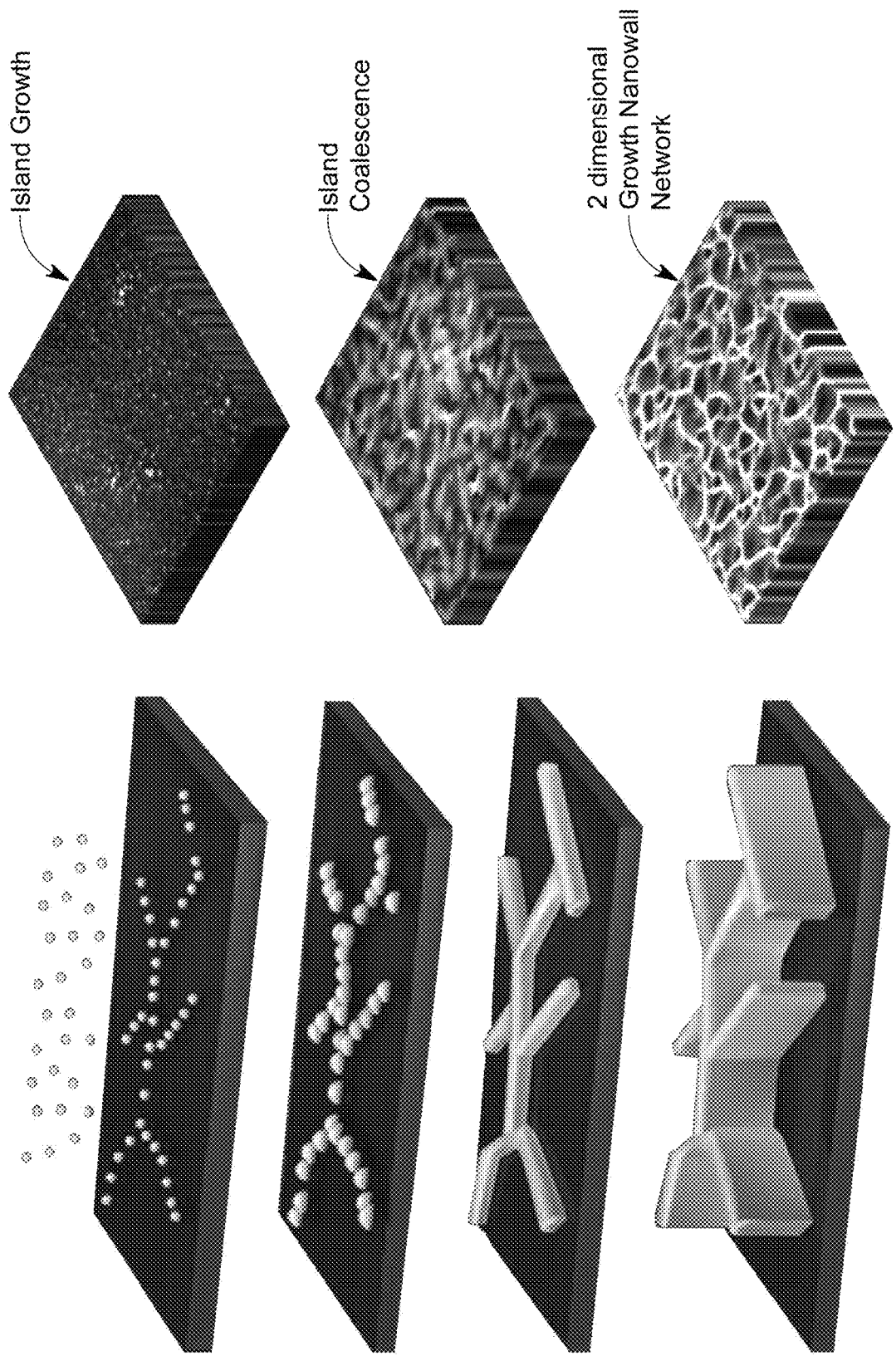
FIG. 5 shows a schematic description of the growth process of ZnO nanowall networks with honeycomb structure and shows a series of SEM images of ZnO nanowall networks grown at different deposition times.

The PLD growth for ZnO nanowall networks was carried out on silicon (100) substrate at a pressure of 10 mTorr for different durations of time ranging from 5 min to 45 min. The PLD growth temperature used was 600° C. SEM images of ZnO nanowall networks at different deposition durations of time, 5 minutes, 15 minutes, and 45 minutes, show progression of island growth, island coalescence and 2 dimensional growth to faint a nanowall network. These images show that the two dimensional ZnO nanowall networks were grown vertically on the substrates. The pores size ranges from 50 nm to 140 nm and the walls between the walls exhibit a thickness of ~50 nm. The size of the nanowalls is remarkably uniform over the whole substrate. The density of the nanowalls increased with the deposition time. FIG. 5 illustrates the growth process of the ZnO NWaN with honeycomb structure by PLD.

Figure 6:
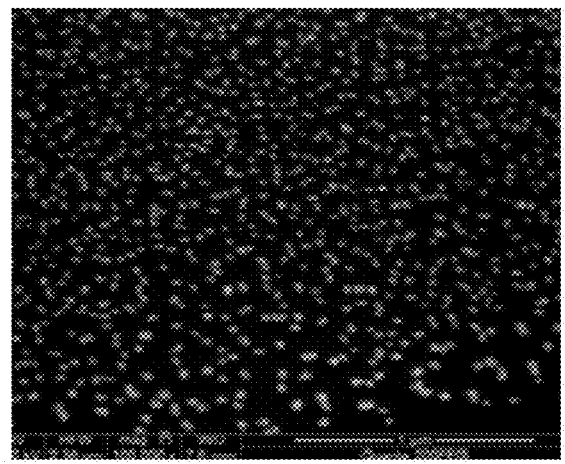
FIG. 6 is a series of SEM Images of ZnO nanowalls grown at different deposition times.
Figure 6:
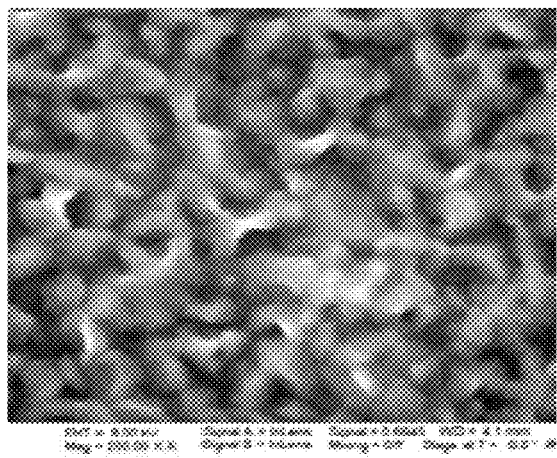
Figure 6:
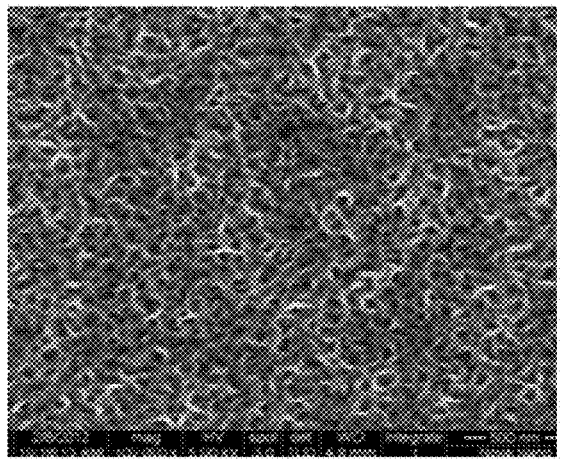
Figure 6:
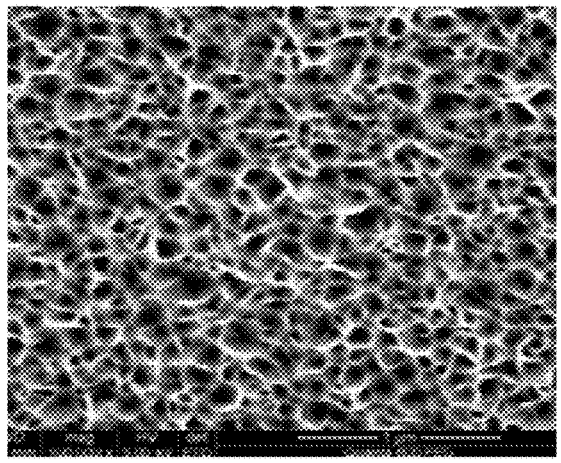

FIG. 6 is another series of SEM images of ZnO seed layer deposited on Si (100) P(O$_2$)=10 mTorr, Ts=600° C. at different deposition times. P(O2) means the oxygen pressure and Ts means the substrate temperature.

Figure 7:
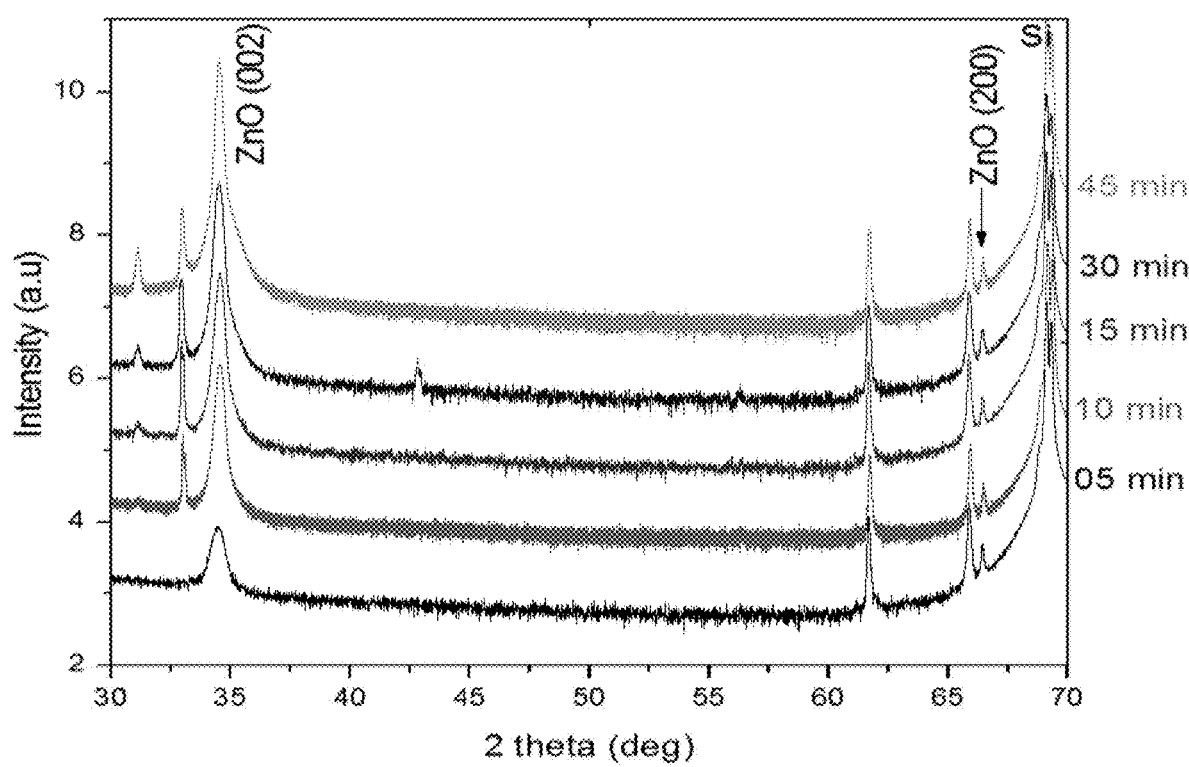
FIG. 7 is a series of XRD spectra of ZnO thin films grown at different deposition times.

The XRD spectra of the deposited ZnO nanowall networks at different deposition times are shown in FIG. 7, The diffraction peak of the ZnO nanowall networks occurs at 34.5, which is related to the ZnO (0002) Bragg Reflection in addition to the (200) plane. This suggests the fully c-axis preferred orientation of the nanowall networks. Increasing the duration of deposition improves the film crystallinity quality. With the increase in film thickness the deposited layer provides the nucleation centers and allows the highly crystalline layer due to the reduction in the formation energy. Highly c-axis oriented film can be obtained at higher thickness and crystallinity is found to depend strongly on film thickness, deposition rate and substrate temperature.

Figure 8:
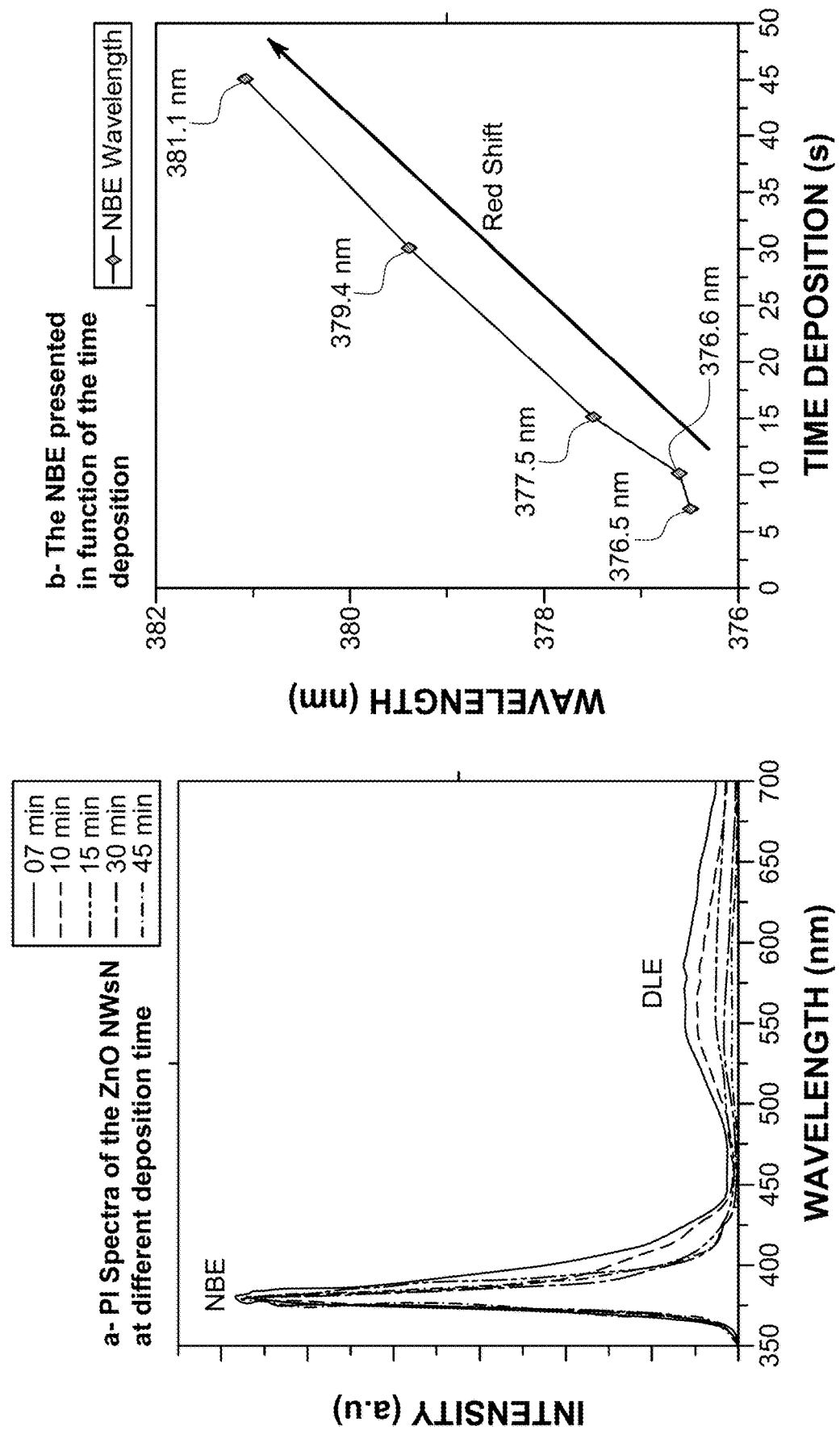
FIG. 8a is a series of room temperature photoluminescence spectra of ZnO seed layer grown at different deposition times.
FIG. 8b is NBE variation as a function of the deposition time.

FIGS. 8a and 8b depict the photoluminescence (PL) measurements at room temperature (RT) using HeCd Laser (325 nm, 8 mW) for all the samples. It presents different peak positions of the band edge emission in the UV region as well as defect induced emissions in the visible region, ZnO NWaNs grown at different deposition times showed very similar PL spectra, dominated by a strong, narrow ultraviolet (UV) emission centered between 475 and 382 nm. This UV emission is attributed to free exciton recombination and near band transition of wide band gap ZnO which is considered as the Near Band Energy (NBE). FIG. 8b shows that NBE peaks at different deposition times present a blue shift as a function of the deposition time, reflecting that by increasing the deposition time (thickness of the film), less quantum confinement can be identified.

Defect level emission (DLE) band is broad and intense. It is composed of an emission peak centered in the green and yellow band. The peak in the green zone is assigned to shallow donor effects (doubly occupied vacancies/zinc interstitials) and the one in the yellow zone is assigned to deep effects (oxygen interstitials). Defects traditionally associated with the green emission include oxygen vacancies and interstitial Zn atoms, whereas interstitial O atoms have been suggested as carriers of the orange red emission. The importance of oxygen vacancies increases with the deposition time. The oxygen vacancies emission at about 541.363 nm, 546.772 nm, 547.7634 nm, 542.895 nm and 548.57 nm corresponding to the samples at 7, 10, 15, 30, and 45 minutes respectively. On the other hand, the oxygen interstitials emission at 584.746 nm, 584.1803 nm and 586.25 nm correspond to the samples at 10, 15, and 45 minutes respectively. The peaks are very weak compared with the near band energy emission. To evaluate the defect level of ZnO nanowall network with honeycomb structure at different deposition time, the intensity ratio of the NBE to that of DLE $$\left(r = \frac{I_{NBE}}{I_{DLE}}\right)$$

can be calculated. The larger the ratio, the better quality of the deposited film.

Effect of Oxygen Pressure on the Growth of ZnO Nanowalls

Figure 9:
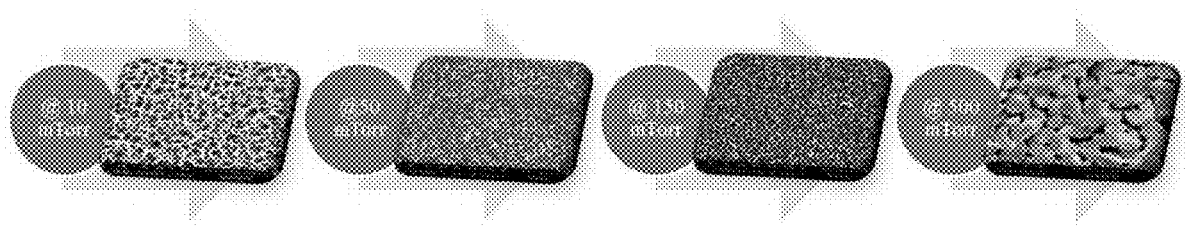
FIG. 9 is a series of SEM images illustrating the morphology of ZnO nanowalls grown at different oxygen pressures.
Figure 10:
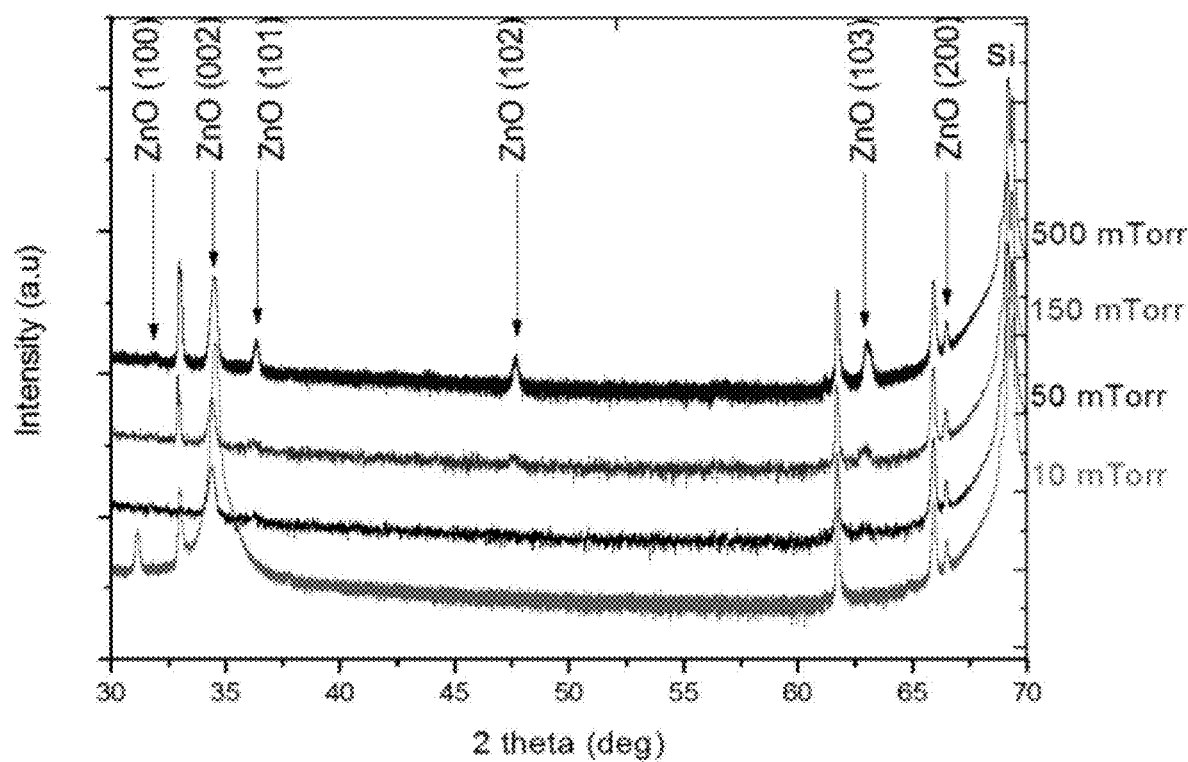
FIG. 10 is a series of XRD spectra of ZnO thin films grown at different oxygen pressures.

ZnO thin film was deposited at different oxygen pressure maintained during the deposition. The pressure ranged from 10 mTorr to 500 in Torr. The substrate temperature was 600° C. and the deposition time was 45 minutes. FIG. 9 shows SEM images of ZnO films deposited at varied oxygen pressures (10 mTorr, 50 mTorr, 150 mTorr and 500 mTorr). In FIG. 10, the morphology of films obtained at low oxygen pressure is quite different from that obtained at high oxygen pressure.

At a low pressure of 10 mTorr, the film is composed of ZnO nanowall network with honeycomb structure with non-uniform cell size. While at a higher pressure, a macroporous film is grown on the silicon substrate, and composed of nanopost with pencil shape morphology.

FIG. 10 is a series of XRD spectra of ZnO thin film at a deposition time of 45 minutes, substrate temperature of 600° C., laser energy of 500 mJ, and at different oxygen pressures: 10 mTorr, 50 mTorr, 150 mTorr, and 500 mTorr. The crystallinity of the thin film deposited depends on the oxygen pressure. The films deposited at higher oxygen pressure of 500 mTorr show random orientation and more peaks: (002), (101), (102), (103), (200) planes are present on the spectrum of FIG. 10. Thus the crystalline quality has degraded. When oxygen pressure decreases, some peaks vanish or become weaker, the film quality is improved and crystallites become more aligned, only (002) and (200) planes are shown suggesting the fully c-axis preferred orientation of the film.

FIG. 11a presents different peak positions of the band edge emission in the UV region (NBE) as well as defect induced emissions in the visible region (DLE). The PL spectra of different thin films deposited at different pressures are very similar, dominated by a strong, narrow ultraviolet (UV) emission centered at 381.1 nm (3.253 eV), 378.75 nm (3.27 eV), 376.12 nm (3.297 eV) and 375.857 nm (3.3 eV) corresponding to the deposition at oxygen pressures of 10 mTorr, 50 mTorr, 150 mTorr and 500 mTorr, respectively.

By increasing the pressure, the band edge emission in the UV is blue-shifted (FIG. 11b) of 20 meV, 27 meV and 3 meV, which is similar to the results observed in semiconductor quantum dots and quantum well. On the other hand, by decreasing the oxygen pressure, more peaks in the visible region are identified due to several factors such as oxygen deficiency, impurities centers, and presence of particles onto the surface. This is reflected by the intensity ratio of NBE to DLE that can be identified in the green and yellow region of the visible area. The ratio for the green emission is 20, 226.7, and 226.7, while for the yellow emission the ratio is 19.7, 266.7, and 266.7 corresponding to samples at 10, 50 and 150 mTorr. No DLE can be identified for the ZnO NWaN deposited at 500 mTorr.

Figure 11:
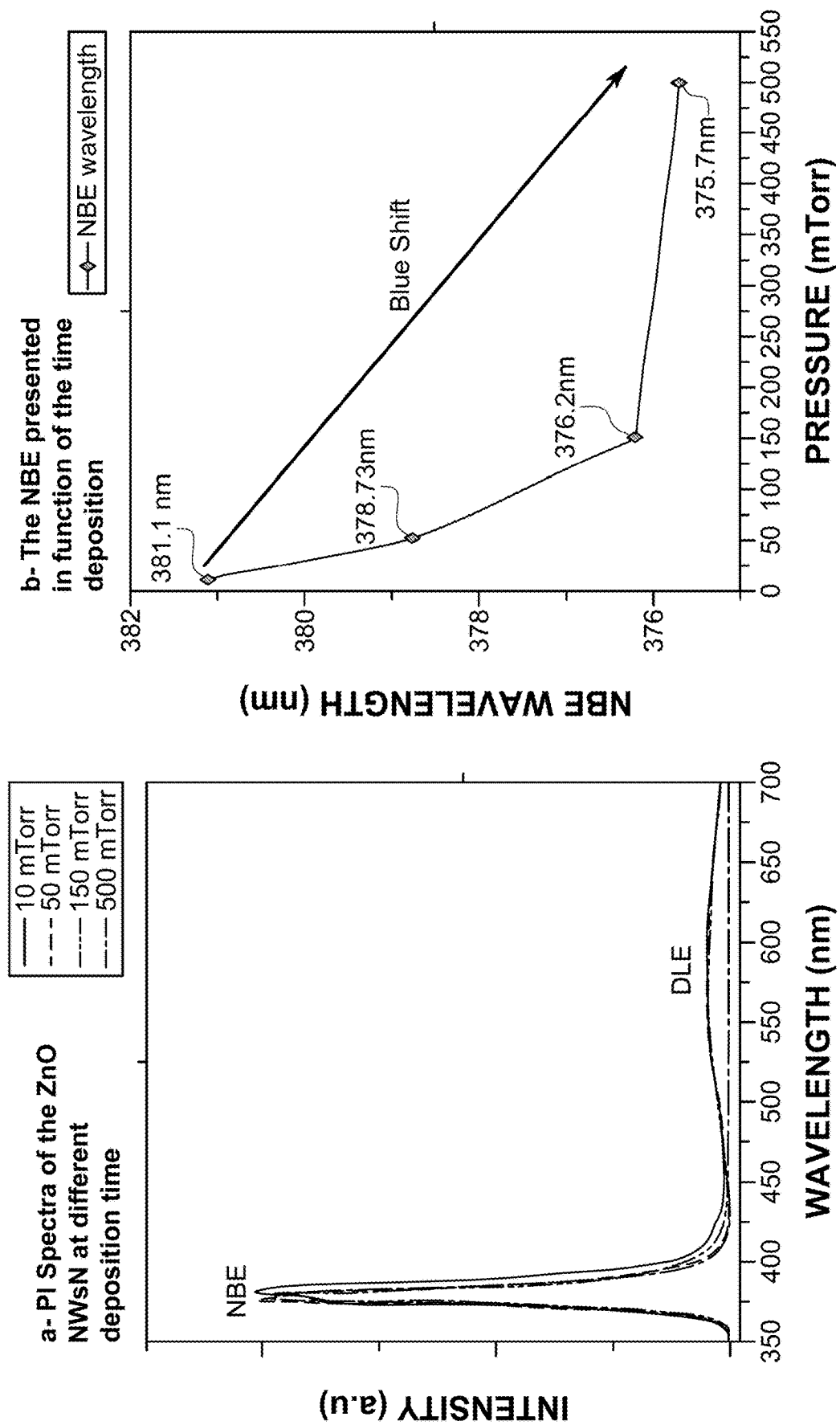
FIG. 11a is a series of room temperature photoluminescence spectra of ZnO seed layer grown at different oxygen pressures.
FIG. 11b is NBE variation as a function of the background oxygen pressure.
Figure 12:
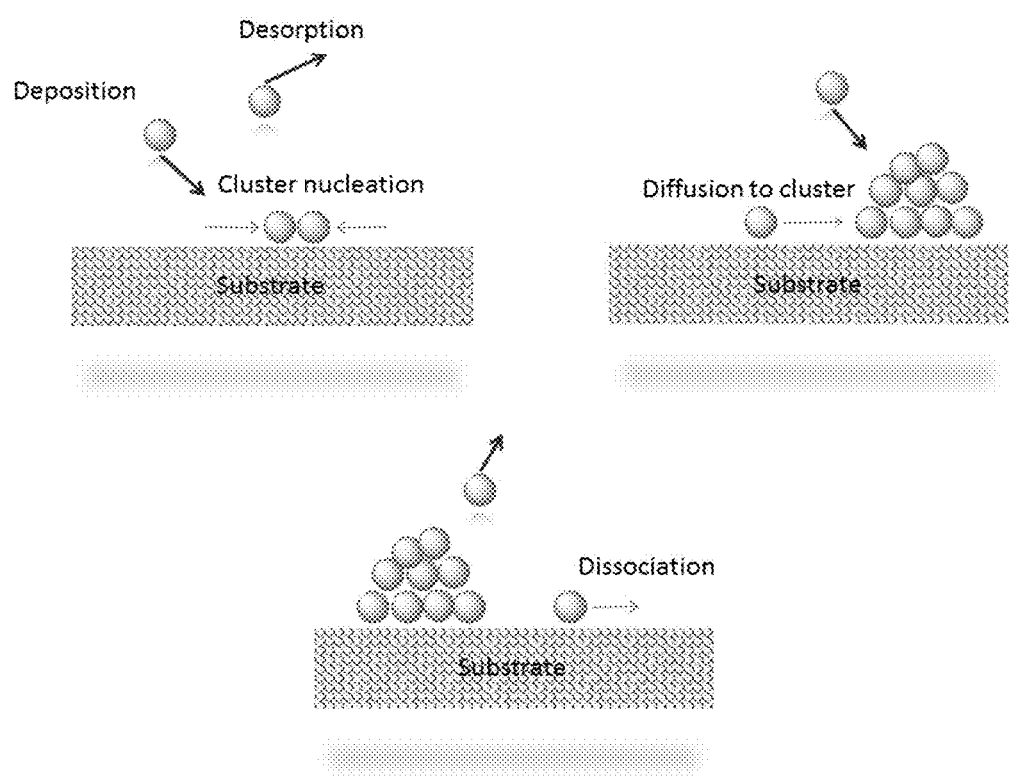
FIG. 12 is a schematic description of the deposition process of ZnO nanoparticles (NPs).

PLD makes the composition of a stoichiometric ZnO target surface, besides substantial loss of target surface material under successive laser ablation at low oxygen pressure. At low pressure, the emitted atoms and ions from the target surface, after laser interaction, condense on the substrate surface to form a continuous film. The mean free path of the ablated species depends upon the processing pressure and increases with decreasing pressure. When films are processed under high surface pressures, the ablated species undergo a large number of collisions with background gas molecules and the condensation of species in the gas phase results in the formation of nanosized particles reflected in the blue shift of the UV emission wavelength (FIG. 11). The settlement of these nanoparticles, on the surface of the substrates, promotes the formation of a dense and smooth film (FIG. 12 shows the deposition process of ZnO nanoparticles). The nucleation of nanoparticles on the substrate is controlled either by the processing conditions or by using a catalytic layer and leads to the fabrication of interesting nanostructures. The deposition at (10 mTorr) leads to reduction in the strain with minimal surface roughness. Oxygen pressure influences both the deposition rate and the kinetic energy of ejected species. The kinetic energy of the ablated species reduces with the increase in pressure due to the large number of collisions with background gas molecules and it is commonly observed that the size of the ablated plume decreases with increase in oxygen pressure.

Effect of Substrate Temperature on the Growth of ZnO Nanowalls

Figure 13:
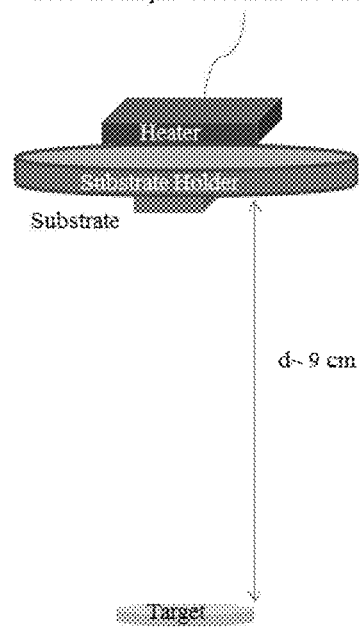
FIG. 13 is a diagram showing the relationship between the set temperature (heater) and the actual temperature (substrate) for growing ZnO nanowalls.
Figure 13:
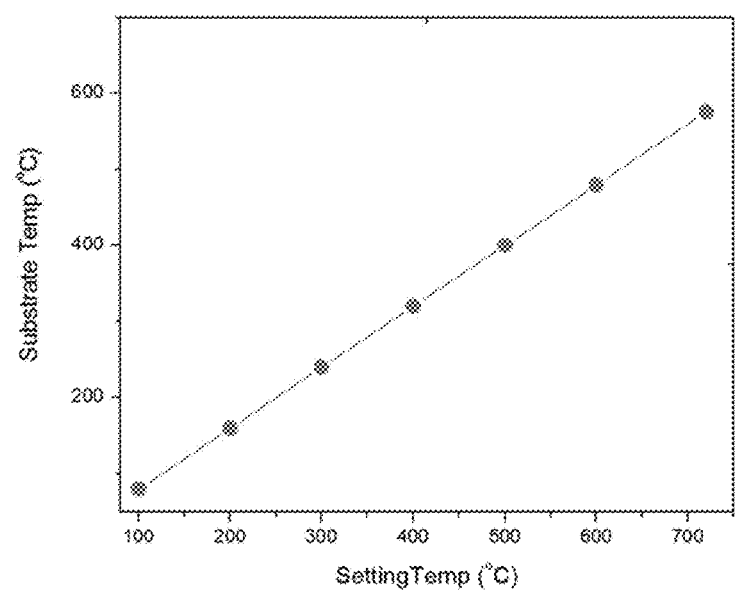

FIG. 13 is a diagram showing the relationship between the set temperature (Heater) and the actual temperature (Substrate). To be more accurate about the substrate temperature, it was noticed that the temperature of the substrate was 20% less than the set temperature (provided by the manufacturer).

Figure 14:
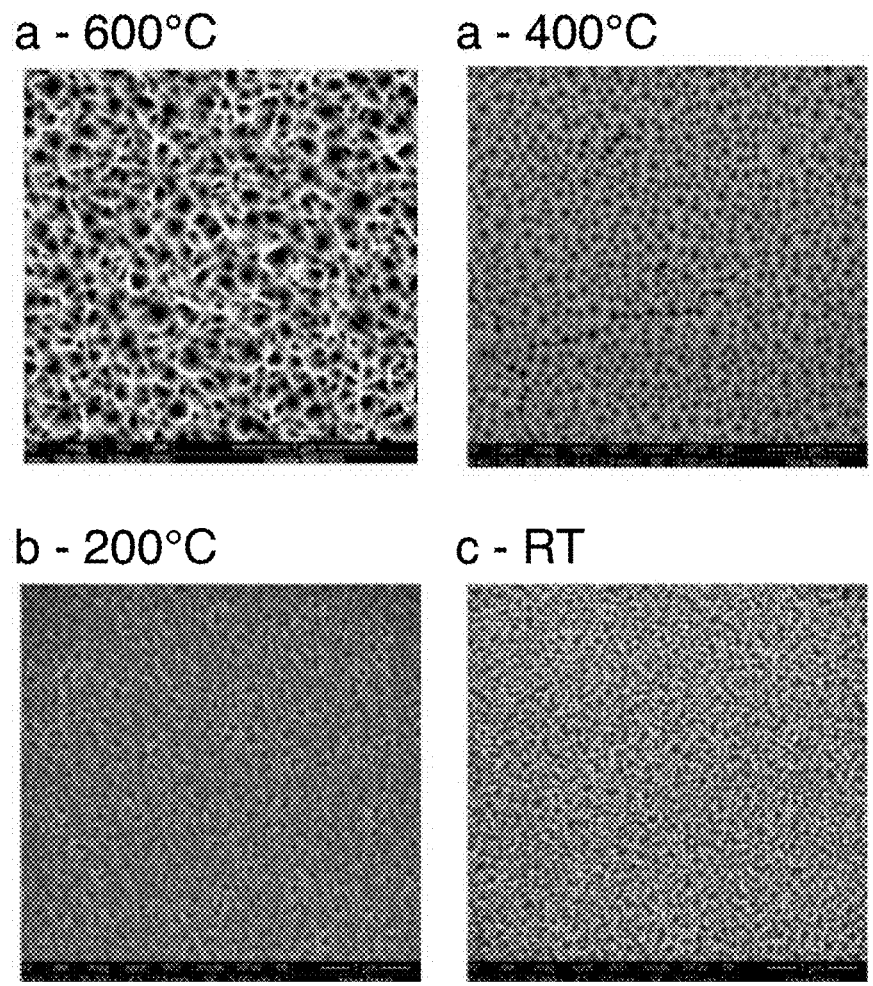
FIG. 14 is a series of SEM images illustrating the variation of morphology of ZnO nanowalls grown at different temperatures.

The ZnO films were also deposited at different substrate temperatures (600° C., 4000° C., 2000° C. and RT). The chamber was maintained at an oxygen pressure of 10 mTorr during the deposition with a growth period of 45 min. FIG. 14 shows SEM images of the ZnO nanowalls network with honeycomb structure grown on Si substrates. FIG. 14 illustrates the variation of morphology at different temperatures from 500° C. to room temperature. The interlinked ZnO nanowalls were obtained at 600° C., 400° C.; while at room temperature (RT), it didn't show any nanowall structure.

SEM images of the ZnO nanowalls and network with honeycomb structure grown on Si substrates, deposited on Si(100) t=45 min, P(O$_2$)=10 mTorr at different temperatures, 400° C. 200° C., and room temperature show interlinked ZnO nanowalls were obtained at 600° C., 400° C., while at 200° C. and room temperature there was no nanowall structure. The width and height of the nanowalls were 120±50 nm and 800 nm respectively.

Figure 15:
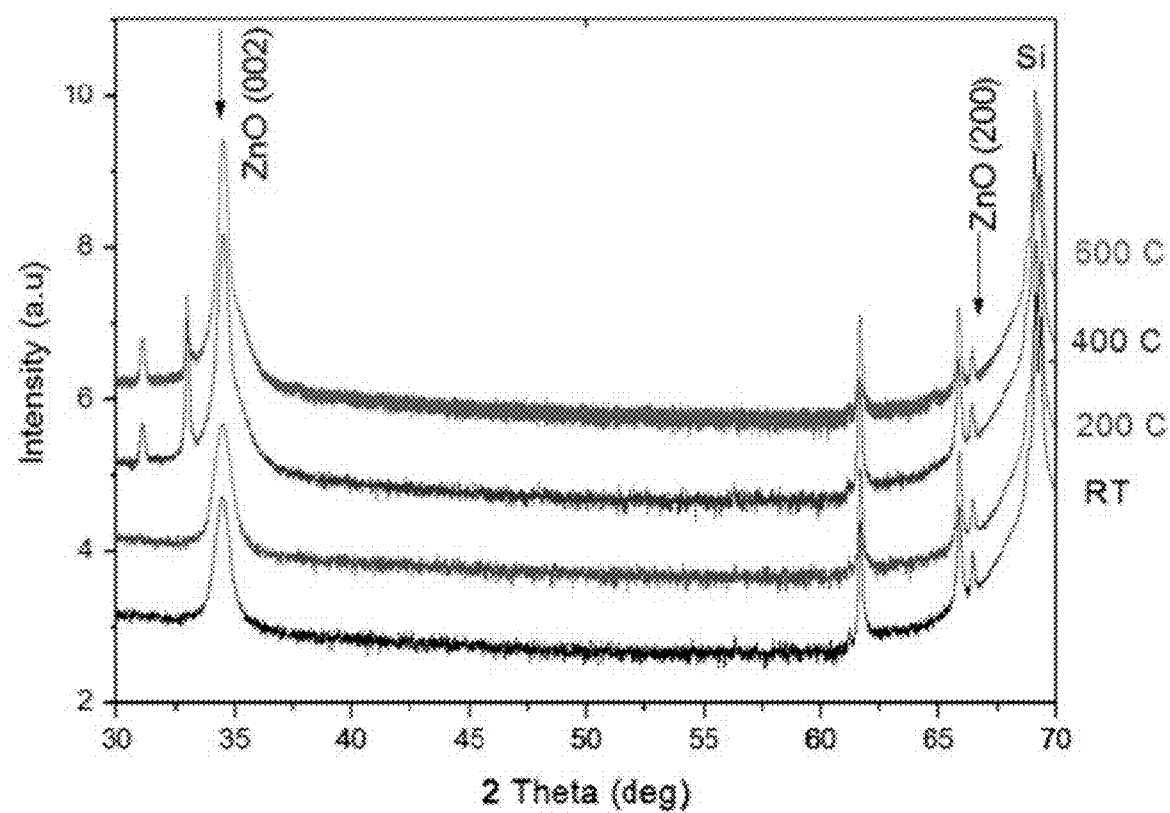
FIG. 15 is a series of XRD spectra of ZnO thin film grown at different temperatures.

FIG. 15 shows X Ray Diffraction pattern of the ZnO nanowalls grown at 600° C., 400° C., 200° C. and RT on Si substrates without using catalyst. In addition to the substrate and substrate holder peaks, ZnO nanostructures show strong peaks corresponding to ZnO (002) and (200) planes. The strong (002) peak shows that the ZnO nanostructures were preferentially oriented along the c-axis [0002] which indicates that the nanostructures grown on the Si substrates at different temperatures have good epitaxial orientation.

Figure 16:
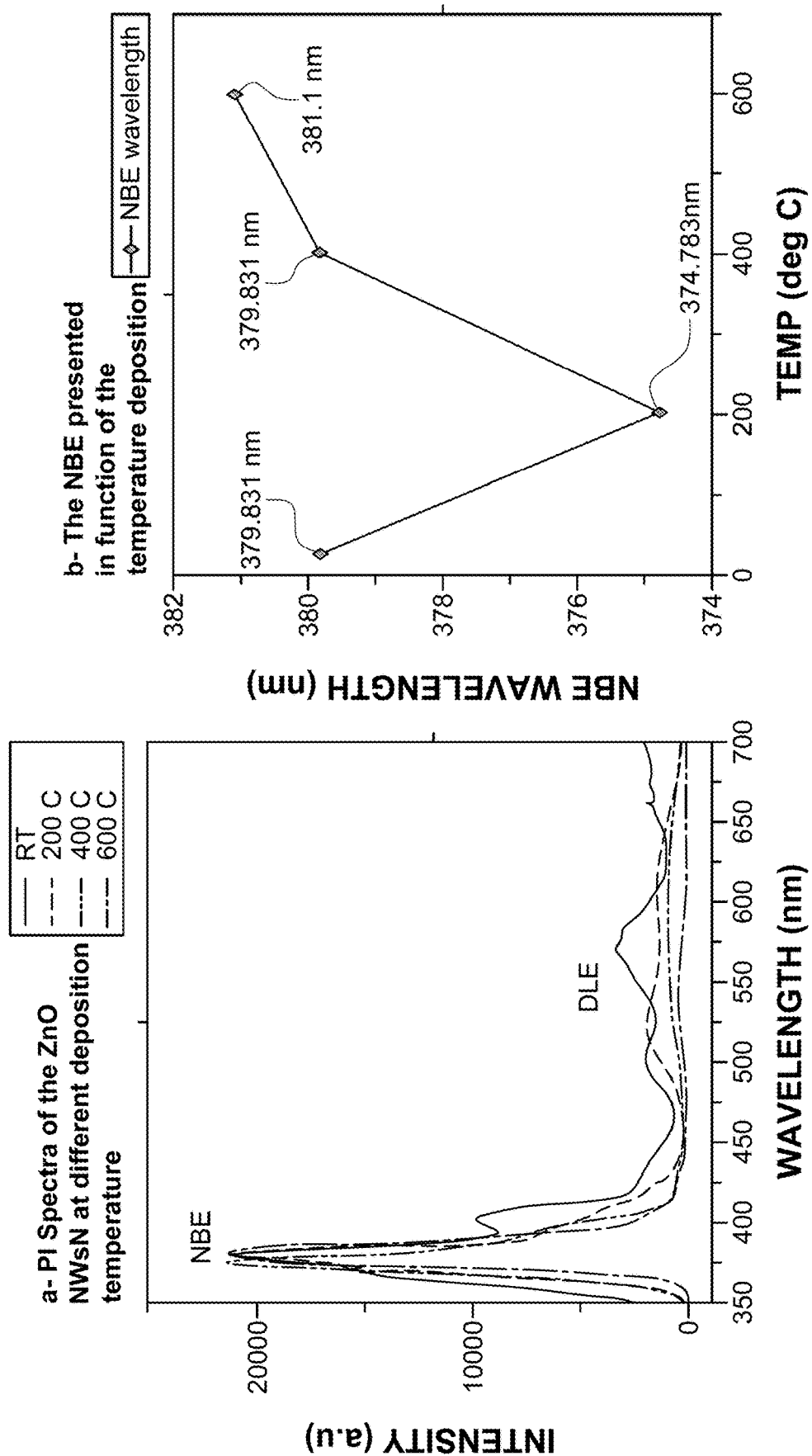
FIG. 16a is a series of room temperature photoluminescence spectra of ZnO seed layer grown at different substrate temperatures.
FIG. 16b is NBE variation as a function of substrate temperature.

FIG. 16a compares the photoluminescence spectra of the ZnO nanowalls networks grown at 600° C., 400° C., 200° C. and RT on Si substrates. The spectra show a strong near band edge (NBE) emission of ZnO around 379.831 nm (3.264 eV), 374.7831 nm (3.3 eV), 379.831 nm (3.264 eV) and 381.1 nm (3.253 eV) corresponding to the samples deposited at RT, 200° C., 400° C. and 600° C., respectively.

FIG. 16b shows that the NBE is red-shifted starting from 200° C. The RTPL spectrum of the thin film deposited at RT reveals more peaks in the UV-blue region at 370.486 nm (3.347 eV), 379.831 nm (3.264 eV) and 403 nm (3.07 eV). Usually, at low temperatures, excitons are bound to donors or acceptors in ZnO lattice and PL emission comes predominantly by their recombination. This luminescence is called bound exciton (BX) emission and it is placed at energies (~3.36-3.38 eV, ~366-369 nm, at low temperature) slightly lower than ZnO energy gap. The emission at 403.3 nm (3.07 eV) is attributed to transitions from conduction band to zinc vacancy levels.

Growth of ZnO Nanowires Using PLD

Very high quality, vertically oriented ZnO NWs were successfully grown on ZnO Seed layer by PLD. By increasing the oxygen pressure in the chamber to 500 mTorr, nanopillars with hundreds of nanometers diameter (nanopost with pencil shape morphology) were obtained. Increasing the pressure (>500 mTorr) can decrease the diameter of the nanopillars and decrease the distance between the target and the substrate. Nanowires can be grown at relatively low temperature, lower than 500° C. and in argon environment at high pressure, such as 5-10 Torr. Catalyst is not used. Highly crystalline ZnO seed layer can be used.

Figure 17:
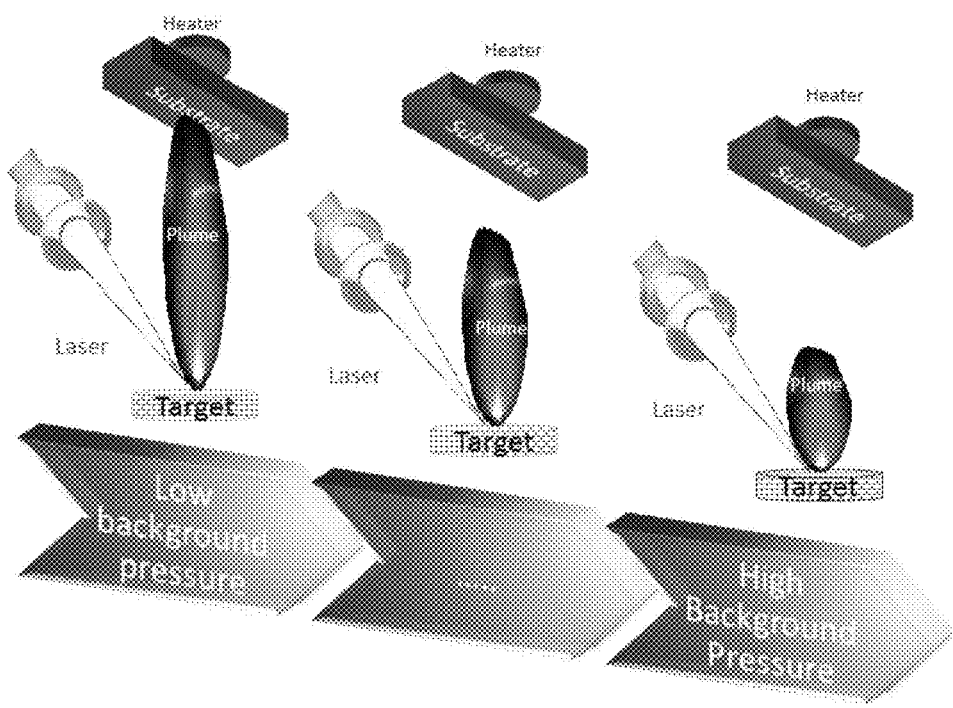
FIG. 17 is a schematic description showing that plume size decreases with the increase of background pressure.
Figure 18:
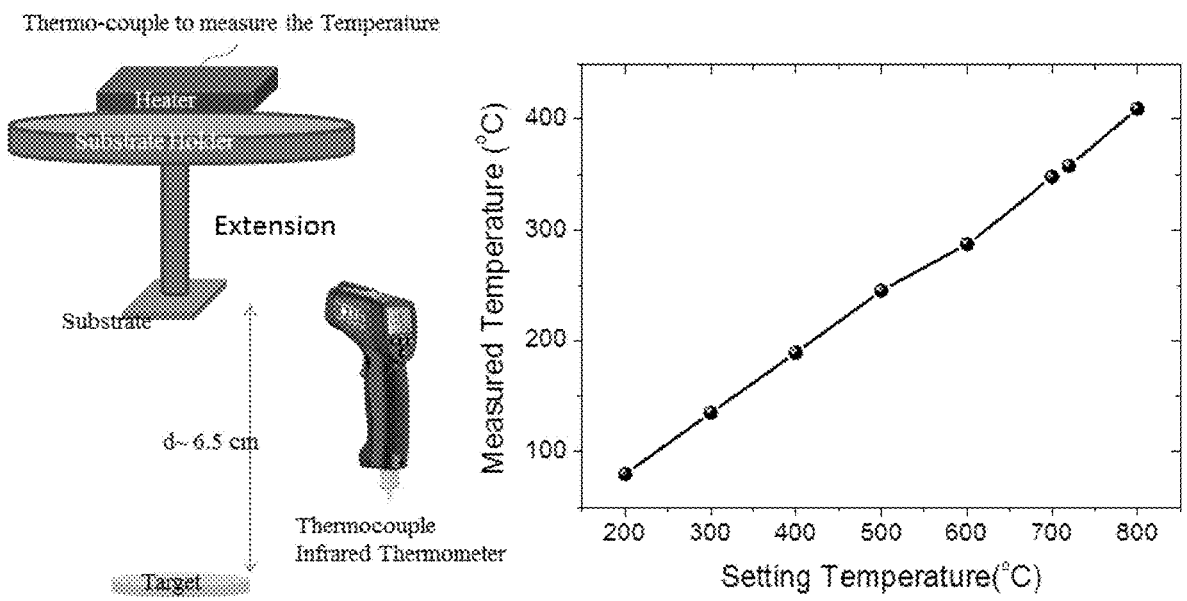
FIG. 18 is a schematic description of the temperature measurement setup and a graph depicting the substrate temperature as a function of the heater temperature.

A KrF excimer laser (248 nm) was used as the ablation source with a repetition rate of 10 Hz and pulse laser energy of 400 mJ/Pulse corresponding to an energy density of ~8 J/cm$^2$ on the target surface using a high purity ZnO (99.99%) as the target. Prior to deposition, the P-type Si (100) substrates were ultrasonically cleaned with acetone and isopropanol followed by compressed argon drying. The samples were introduced in a high vacuum chamber evacuated to a base pressure of about $10^{-6}$ Torr. The target-substrate distance was maintained at 9 cm. The substrate was heated to 600° C. with a rate of 30° C./min and maintained during the deposition in the presence of oxygen (>99.99% purity) with a pressure of 10 mTorr to grow a ZnO seed layer (SL). Nanowires growth was then performed on the deposited ZnO SL c-axis oriented, at a temperature lower than 500° C. in a background argon pressure. The substrate-target distance can be shortened to 6.5 cm. FIG. 17 indicates that plume size decreases with the increase of background pressure. Substrate temperature was measured in air in order to identify the relationship between the set temperature and the substrate temperature (FIG. 18).

A distance between target and substrate of 9 cm is long distance for ablated species to reach. It is suggested increasing the pressure (>500 mTorr) to decrease the diameter of the nanopillars and decreasing the distance between the target and the substrate. An extension of 1 cm diameter, and 2.5 cm length was attached to the substrate holder. The distance between target and substrate was shortened to 6.5 cm, considered as the limit; otherwise it will affect the path of the laser. The short distance between target and substrate was also reported in the literature summarized in Table 1.

replaced with sapphire (0001), and randomly oriented ZnO NWs were observed in FIG. 19b.

TABLE 1

| Material | Substrate | Temp (° C.) | Pressure (Torr) | Distance* (cm) | Structure | Diameter (nm) | Length (μm) | Ref |
|---|---|---|---|---|---|---|---|---|
| ZnO | Sapphire (0001) | 600-700 | 1-5 | 2 | Nanorods | 300 | 6 | 1 |
| ZnO | Si(100) | 450-500 | 5 | 2.5 | Nanorods | 120-200 | 12 | 2 |
| ZnO | SiO2/Si/Au | 900 | 400 | — | NW | 20 | 10 | 3 |
| ZnO | Sapphire (0001) | 600 | 5 | 2 | Nanorods | 300 | 6 | 4 |
| ZnO | Si(100) | 600-850 | 4.8-6.3 | 2.5 | NW | 20-50 | 0.5-2 | 5 |
| ZnO | a-sapphire c-sapphire | 1000 | 260 | 1.5 | NW | 200 | 0.5-3 | 6 |
| ZnO | c-Sapphire ZnO SL | 500-800 | 150-500 × $10^{-3}$ | 2.5 | NW | 50-90 | Few μm | 7 |
| ZnO | Sapphire (0001) | — | 260 | 1.2-2.5 | Nanorods | 130-200 | 1.5-4 | 8 |
| ZnO | c-sapphire | 600 | 100-200 × $10^{-3}$ | 5 | Nanorod | 150-200 | 0.9 | 9 |
| ZnO:Al | Sapphire | 650 | 10-2 | 5 | Nanorod | — | — | 10 |
| ZnO:Mg | a-sapphire c-sapphire + Au | 870-950 | 18-150 | 0.5-3.5 | NW | 150 | 1.5-20 | 11 |

1 M. Kawakami, A. B. Hartano, Y. Nkata and T. Okada, Jpn. J. Appl. Phys. 42 (2003) L33.
2. V. Gupta, P. Bhattacharya, Y. I. Yuzuk and R. S. Katiyar, Mat. Res. Soc. Symp. Proc. Vol. 818(2004) M8.26.1
3. Z. Liu, D. Zhang, C. Li and C. Zhou Proc. $3^{rd}$ IEEE conf. on Nanotechnology, 2003, Vol2 pp.59, DOI: 10.1109/NANO.2003.1230980
4. B. H. Agung, M. Kawakami, Y. Nakata, X. Ning, and T. Okada, the $5^{th}$ Pacific Rim conference on Laser and Electro-optics 2003, vol2 pp.667, DOI: 10.1109/CLEOPR.2003.1277210
5. W. Z. Liu, H. Y. Xu, L. Wang, X. H. Li and Y. C. Liu AIP Advances 1,022145 (2011)
6. R. Guo, M. Matsumoto, T. Matsumoto, M. Higashihata, D. Nakamura, T. Okada App. Surf. Scien 255 (2009) 9671-9675
7. L. C. Tien, S. J. Pearton, D. P. Norton, F. Ren, J. Mater Sci (2008) 43: 6925-6932
8. R. Guo, J. Nishimura, M. Matsumoto, M. Higashihata, D. Nakamura, T. Okada Jap. J. App. Phys 47, 1, (2008), pp. 741-745
9. R. J. Mendelsberg, M. Kerler, S. M. Durbin, R. J. Reeves Superlattices and Micorstructures 43 (2008) 594-599
10. H. Kumarakuru, D. Cherns, G. M. Fuge, Surface &Coatings Technology 205 (2011) 5083-5087
11. M. Lorentz, E. M. Kaidashev, A. Rahm, T. Nobis, J. Lenzner, G. Wagner, D. Specmann, H. Hochmuth and M. Grundmann, Appl. Phys. Lett. 86 (2005) 143113
Each of references 1-11 are incorporated by reference in its entirety.

The structural properties of the as-grown nanowires were characterized using Bruker D8 Discover high resolution XRD with CuKα and λ1.5406 A°. The morphological properties were examined with FEI Nova Nano SEM 630, and for the photoluminescence properties, Fluoromax-4 spectrofluorometer Horiba Scientific, was used, with 150 W ozone free Xenon arc lamp and photomultiplier tube as detector. The samples were excited at 325 nm.

Effect of Substrate on the Growth of ZnO Nanowires

ZnO NWs were synthesized by PLD on Si (100), sapphire (0001), and glass coated with ITO substrates. The parameters used for the growth of ZnO nanowires on different substrates are: a temperature of lower than 500° C., an argon pressure of 5 Torr, a deposition time of 30 minutes, and a distance between target and substrate of 6.5 cm.

Figure 19:
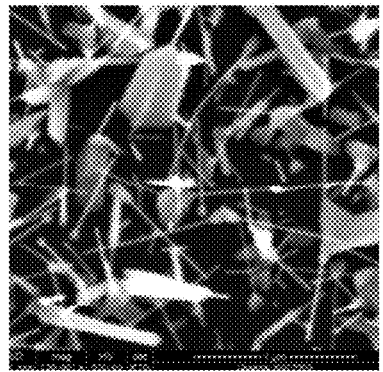
FIGS. 19a-19d is a series of SEM images of ZnO nanowires grown on different types of substrates.
Figure 19:
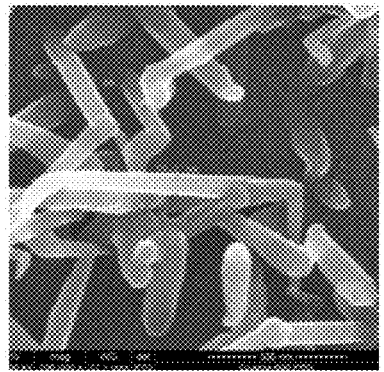
Figure 19:
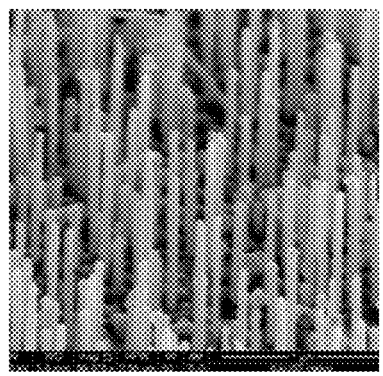
Figure 19:
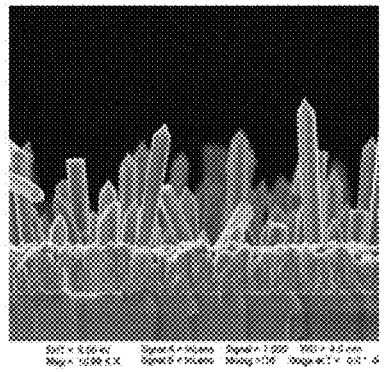

FIG. 19 reveals the morphology of ZnO NWs deposited on different substrates. In FIGS. 19a and 19b, the NWs are randomly oriented because of lattice mismatching; FIGS. 19c and 19d confirm the vertically oriented ZnO NEW grown on ZnO seed layer deposited on Si substrate and glass/ITO substrate. In this experiment, the seed layer (SL) was the ZnO nanowall networks with honeycomb structure grown by PLD. The ZnO NWs grown on glass/ITO exhibit a Pencil shape.

Figure 20:
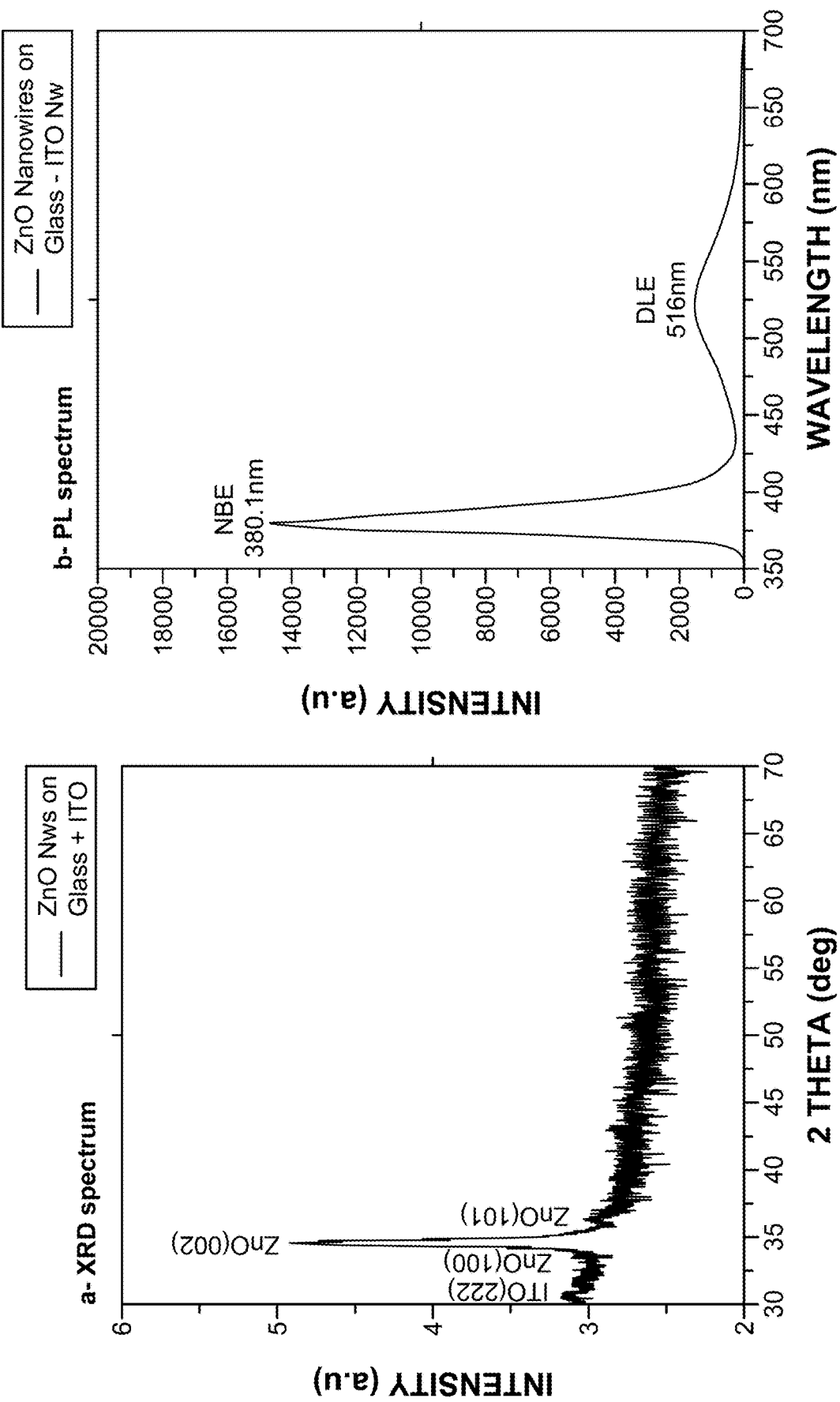
FIGS. 20a and 20b is an XRD spectrum and a PL spectrum of ZnO nanowires grown on glass-ITO.
Figure 21:
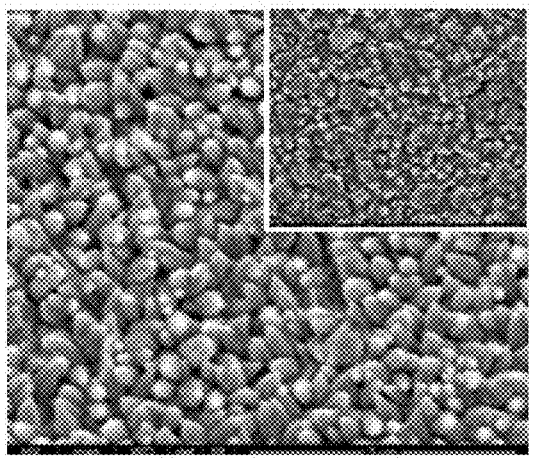
FIGS. 21a-21d is a series of SEM images of the titled view (inset-top view) of ZnO nanowires grown on ZnO seed layer at different pressures.
Figure 21:
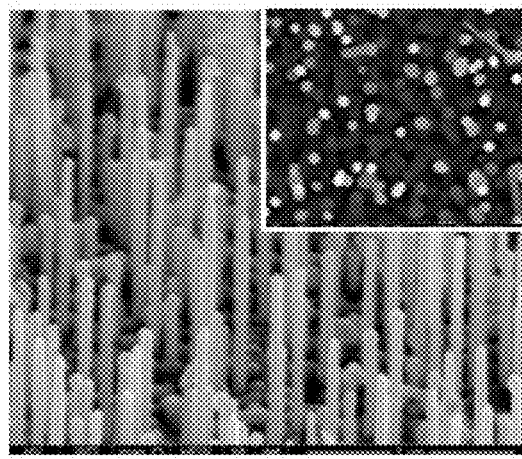
Figure 21:
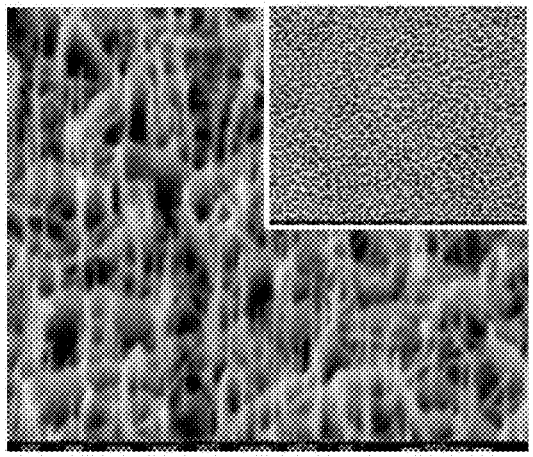
Figure 21:
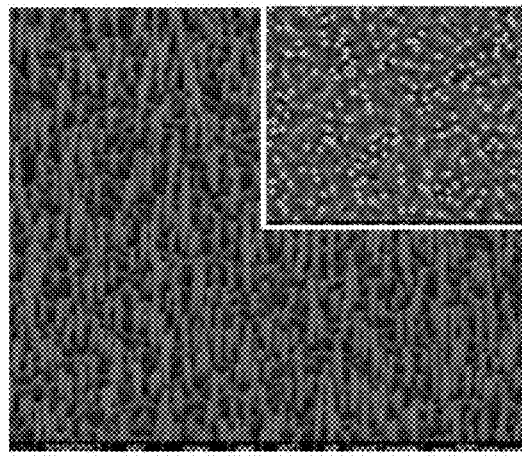

Since ZnO nanowalls with honeycomb structure is formed at 10 mTorr background pressure and ZnO nanopillars are formed when the pressure in the chamber is increased, increasing the gas pressure may decrease the diameters of nanopillars. ZnO NWs randomly oriented were grown on the surface of the Si (100) substrate (FIG. 19a). To test substrates that have better lattice matching, Si substrate was FIG. 20a is an XRD spectrum of the ZnO nanowires deposited on glass substrates coated with ITO with ZnO SL deposited by PLD. This figure reveals a very intense peak at 34.4 which corresponds to (002) plane. ZnO (100) and ZnO (101) peaks indicate that some fraction of the deposited material is not x-axis oriented, and the pattern can be indexed to the ZnO hexagonal wurtzite structure with lattice constants of a=0.325 nm and c=0.512 nm. In comparison with standard diffraction patterns, no characteristic peaks from impurities (Zn) are detected, which indicates that the ZnO NWs possess a high crystalline quality. The room temperature photoluminescence measurement excited by Laser HeCd laser (325 nm, 8 mW) is depicted in FIG. 20b. It presents different peak positions of the band edge emission in the UV region at 380.1 nm (2.4 eV) as well as defect induced emissions in the visible green region at 516 nm (2.4 eV).

Effect of Pressure on the Growth of ZnO Nanowires (NWs)

FIGS. 21a-21d is a series of SEM images of ZnO NWs grown on ZnO SL, at a substrate temperature of lower than 500° C., laser energy of 350 mJ, a distance of 6.5 cm between the target and substrate, and at different pressures: a—2.5 Torr, b—5 Torr, c—7.5 Torr, and d—10 Torr. ZnO nanowires grown at 2.5 Torr has smaller diameter (100-170 nm) than the one grown at 500 mTorr (290-400 nm). At a pressure of 5 Torr, vertically oriented ZnO nanowires are observed in FIG. 21b. The NWs are grown perpendicular to the substrate surface. Moreover, they are characterized by hexagonal edge geometry. Since no catalyst was used, the seed layer may play an important role in the nucleation of the NW directional growth.

Figure 22:
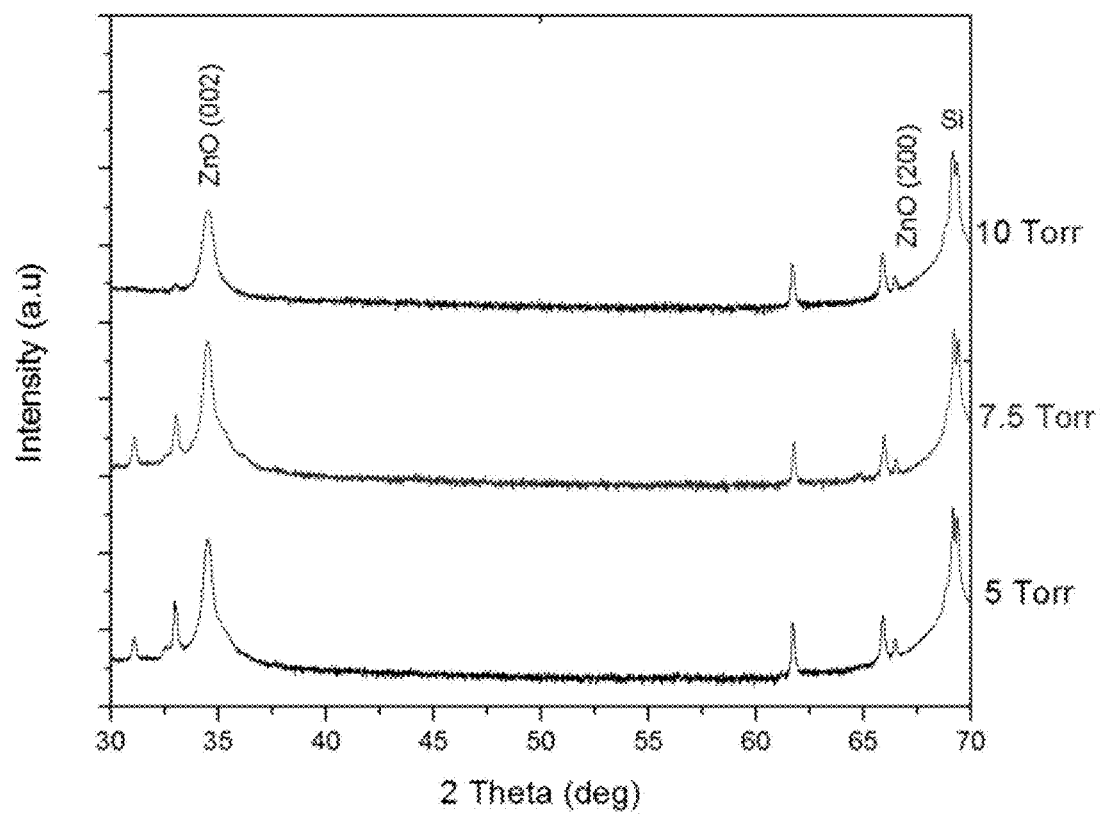
FIG. 22 is a series of XRD spectra of ZnO nanowires grown at different pressures.

A typical XRD pattern of the ZnO NW array grown at pressures of 2.5, 5, 7.5 and 10 Torr is shown in FIG. 22. Only main diffraction lines from the (002) and (004) planes can be observed having the highest peak shown at 34.58° and 34.47° for the NWs at 5 and 10 Torr, respectively. The NWs array has a c-axis orientation. The other diffraction peaks are due to the substrate holder. The slight shift seen between the 2 peaks of the (002) plane direction of the ZnO SL and the ZnO NWs may be caused by the low oxidation of the ZnO NW due to the background argon environment.

Figure 23:
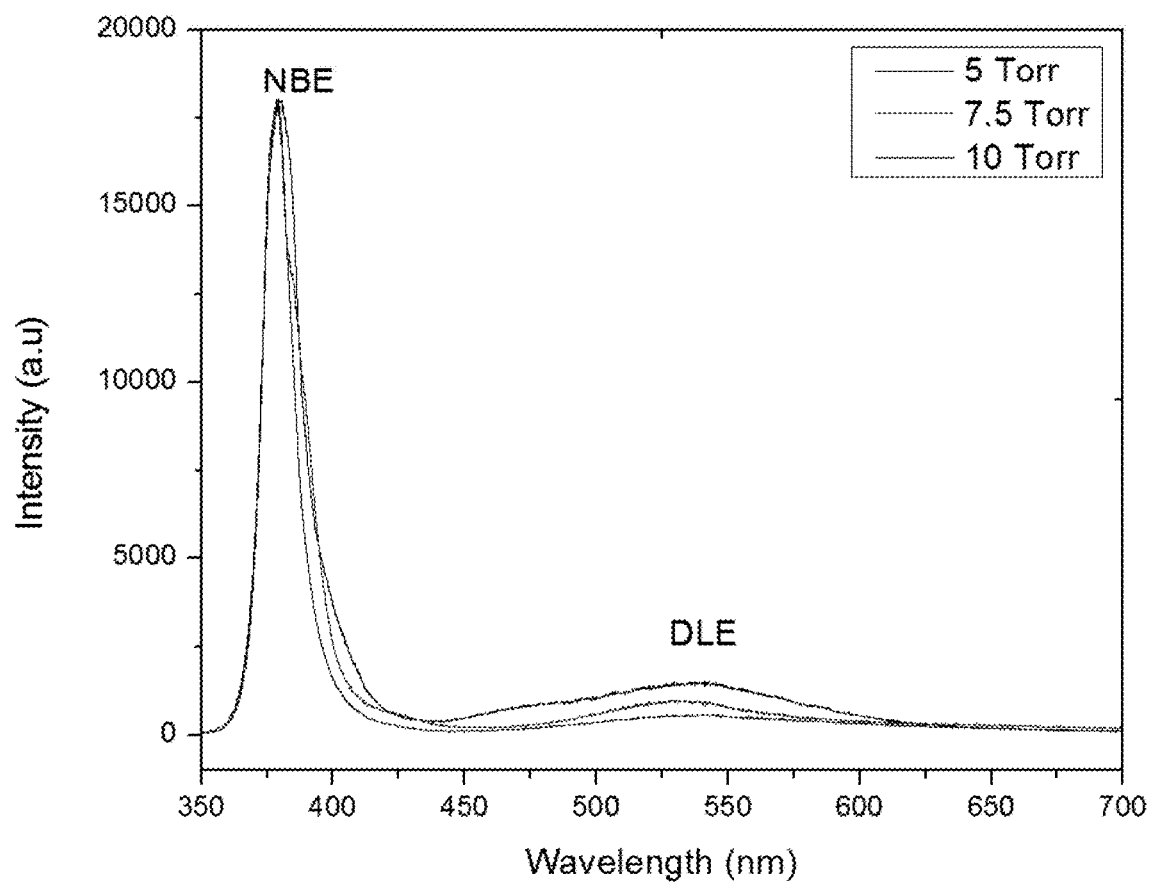
FIG. 23 is a series of PL spectra of ZnO nanowires grown at different pressures.

FIG. 23 depicts photoluminescence (PL) measurements of the ZnO NWs grown by PLD at different argon pressures of 5, 7.5 and 10 Torr. Different peak positions of the band edge emission in the UV region as well as defect-induced emissions in the visible region can be seen. The spectra of NWs grown at different pressures exhibit normal band-gap emission in the UV region at ca. 379.4 inn (3.268 eV), 378.57 inn (3.275 eV) and 379.2 nm (3.27 eV) of the 3 samples at 5, 7.5 and 10 Torr respectively. The emissions in the visible region are green (541 nm (2.29 eV), 530.2 nm (2.33 eV) and 539 inn (2.3 eV) of the 3 samples respectively) and yellow (585 nm). Defect induced emission in the visible region results from several types of defects in ZnO.

Table 2 presents the intensity ratio of UV/visible emission. It shows that the UV to green emission and UV to yellow emission for ZnO NWs are high. By increasing the pressure fewer defects in the NWs are reflected. Other research and other experiment related to ZnO prepared by PLD, showed different morphologies of ZnO thin film prepared by PLD, caused by the effect of oxygen pressure on plume dynamics.

TABLE 2 intensity ratio of UV/Visible of ZnO NWs grown at different pressures.

|  | UV/Green | UV/yellow |
| --- | --- | --- |
| NWs at 5 Torr | 11.868 | 22 |
| NWs at 7.5 Torr | 17.88 | 37 |
| NWs at 10 Torr | 30.6 | 45.4 |

Figure 24:
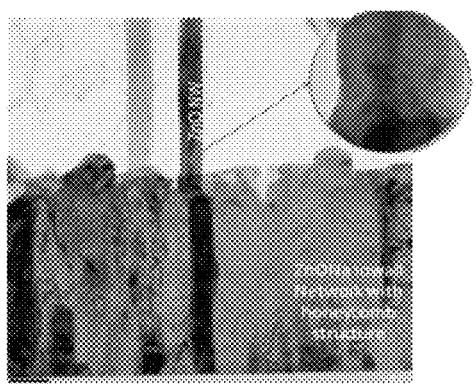
FIGS. 24a, 24b and 24c is a series of TEM images of ZnO nanowires grown on ZnO seed layer.
Figure 24:
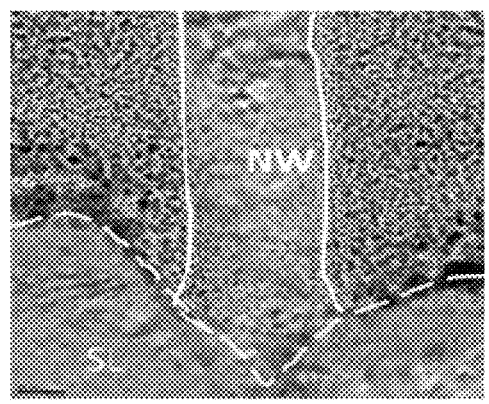
Figure 24:
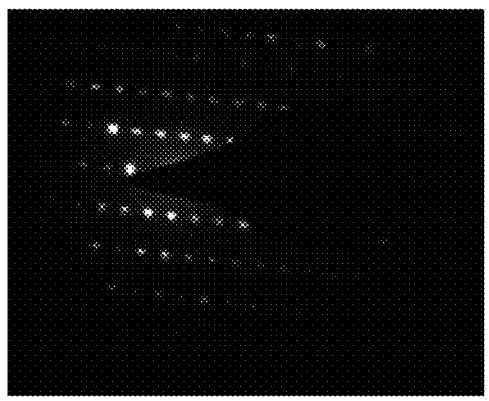
Figure 25:
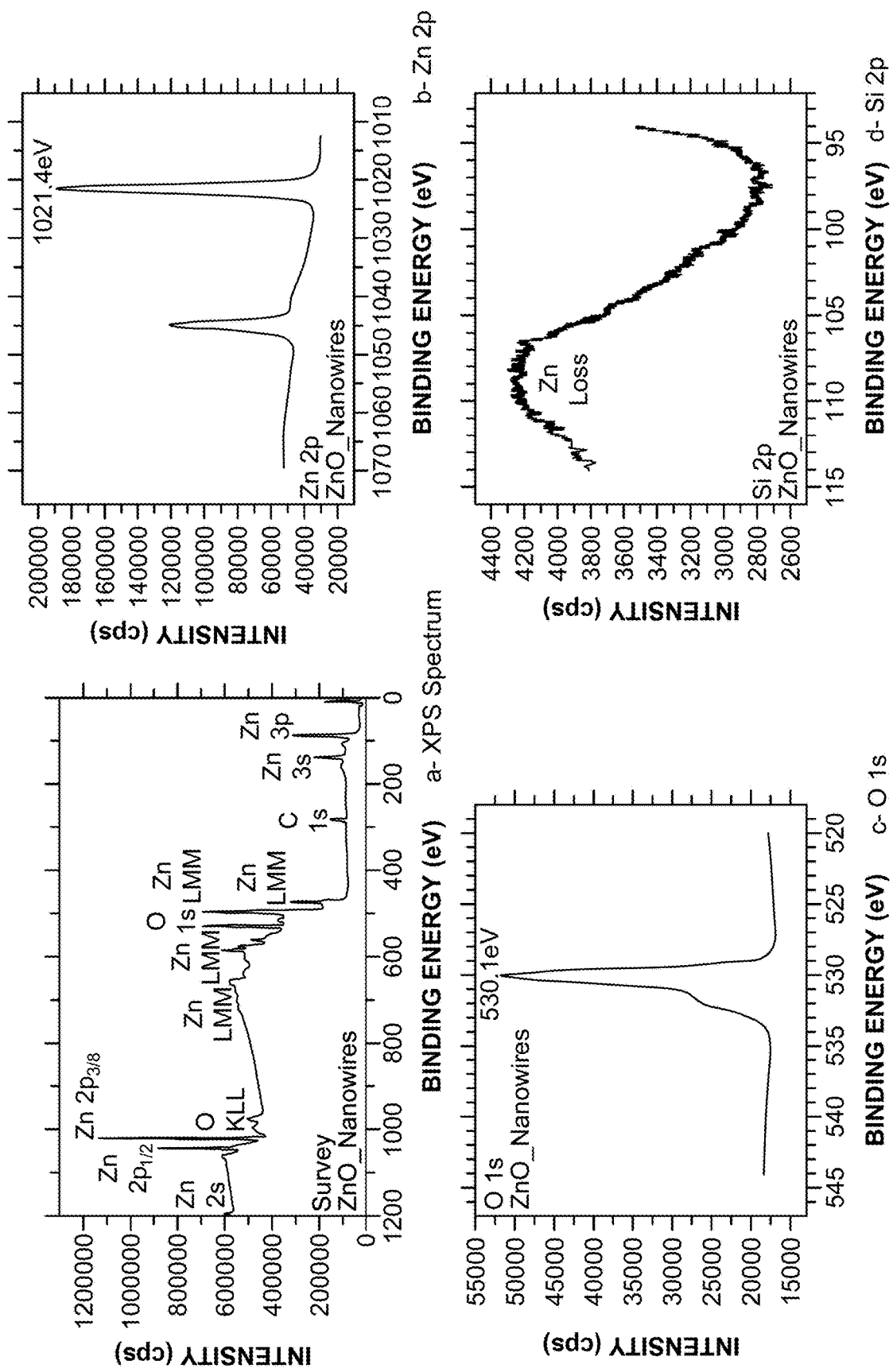
FIGS. 25a-25d is a series of XPS spectra of ZnO nanowires grown on ZnO seed layer.

More detailed structure of the ZnO NWs on ZnO SL is further investigated by TEM. FIG. 24 shows a low resolution image, an HRTEM image, and a selected area electron diffraction (SAED) pattern of a single ZnO NW. The ZnO NWs are very straight with a diameter of about 54 nm. The SAED pattern and HRTEM suggest that the NWs have single domain wurtzite structure with high crystal quality. The HRTEM image shows the lattice distance about 0.52 inn consistent along the c-axis of wurtzite ZnO crystal. The SAED pattern reveals the growth of NWs along the ZnO [0002] Direction, FIG. 24b reveals the growth of ZnO NWs that nucleate from the concave tip near the grain boundaries between two ZnO thin grains.

FIG. 25a-25d is a series of XPS spectra of ZnO nanowires grown at an argon pressure of 10 Torr, a temperature of lower than 500° C. on ZnO seed layer. The XPS spectra from the ZnO NWs indicate the presence of the elements of Zn, O, and C. No contaminations were detected on the sample surface. The XPS spectrum of the Zn-2p is presented in FIG. 25b and O-1s is presented in FIG. 25c. The ZnO NWs display a peak at 1021.4 eV and 1046.1 eV which are in agreement with the binding energies of Zn $2p_{3/2}$ and Zn $2p_{1/2}$ respectively. The ZnO NWs exhibit an asymmetric peak at 530.1 eV observed in O1-s core level spectrum of FIG. 25c. On the other hand, no peaks of Si2p can be identified in FIG. 29d. The ratio of Zn2p, O1s is around 1.24 which is higher than its corresponding ratio calculated for the ZnO NWaN which might be caused by the growth of ZnO NWs in argon Environment (Table 3).

TABLE 3 atomic concentrations of Zn, O, and C elements.

|  | Elements | | | |
| --- | --- | --- | --- | --- |
|  | Zn | O | C | Si |
| Atomic concentration (%) | 44.3 | 35.1 | 20.6 | 0.0 |

The Zn $2p_{3/2}$ spectrum of ZnO suffers from an overlap with the metal peak binding energy. Chemical state determination can be made using the modified Auger Parameter. The modified Auger Parameter (calculated by adding the binding energy of the most intense photoelectron peak with the kinetic energy of the sharpest Auger peak) is equal to 2010.1 eV, which corresponds to ZnO NWs.

Effect of Deposition Time on the Growth of ZnO Nanowires

Figure 26:
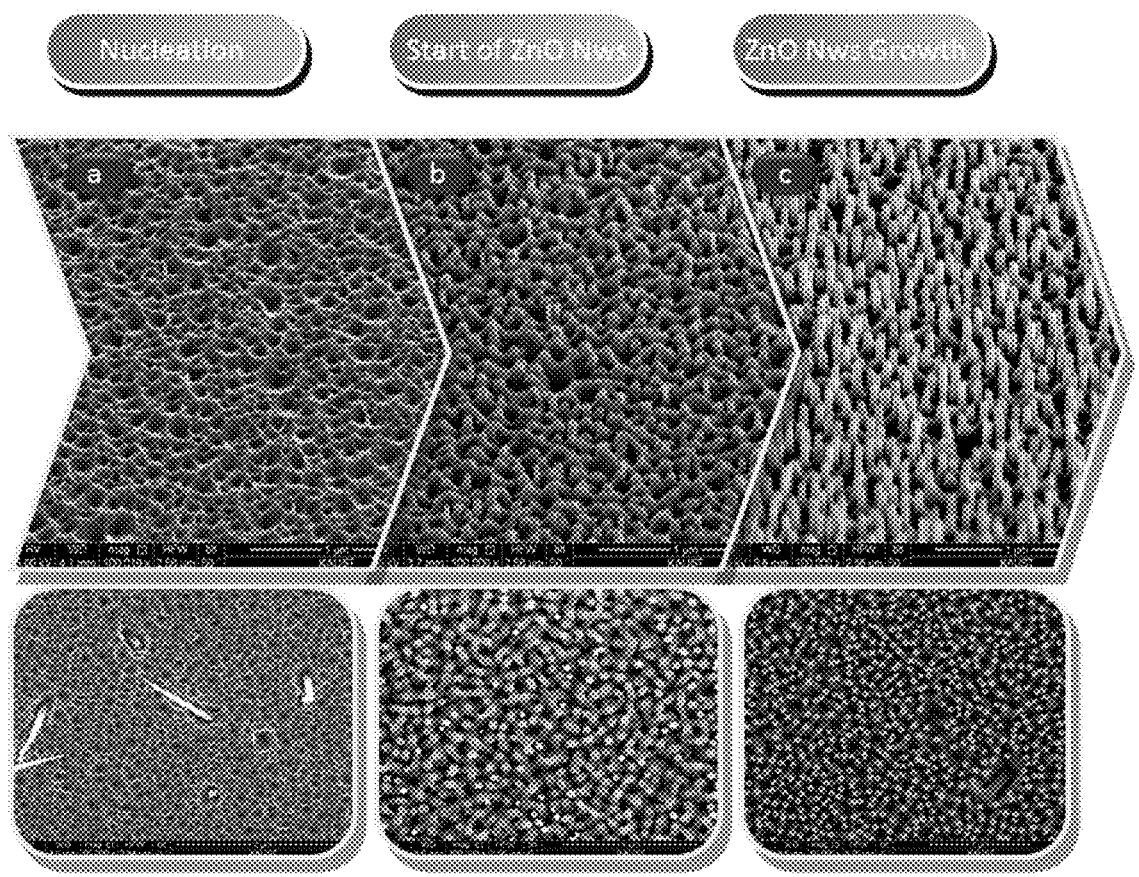
FIGS. 26a-26c is a series of SEM images titled/top view of ZnO nanowires grown on ZnO seed layer at different deposition times.

FIGS. 26a-26c is a series of SEM images titled/top view of ZnO nanowires grown by PLD on ZnO seed layer at a pressure of 10 Torr, at a substrate temperature of lower than 500° C., with laser energy of 350 mJ, and for different deposition times (FIG. 26a for 10 minutes, FIG. 26b for 20 minutes, FIG. 26c for 30 minutes). For example, at a deposition time of 20 minutes, the growth starts and ZnO nanowires have a diameter of about 48 nm and length of about 100 nm, while at 30 minutes of deposition, the diameter increases to about 58 nm and the length to about 200 nm.

Figure 27:
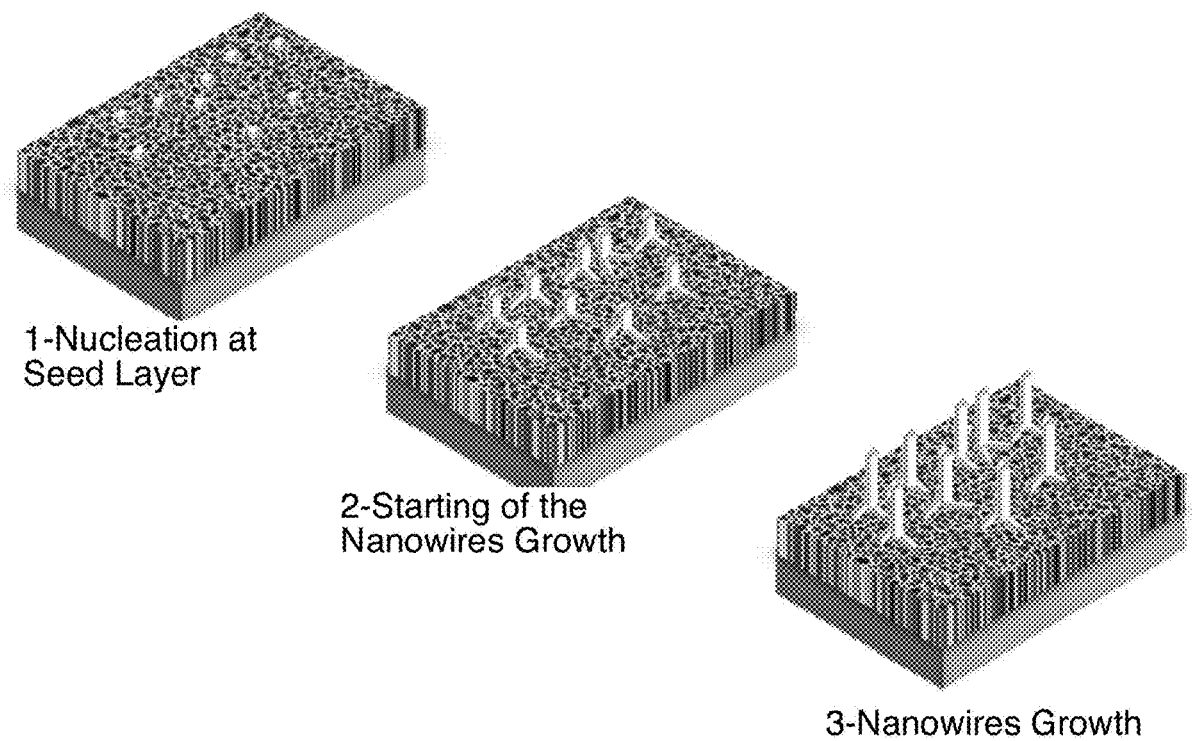
FIG. 27 is a schematic depiction of the growth process of ZnO NWs on ZnO seed layer by PLD.

FIG. 27 is an illustration of the suggested growth process of ZnO NWs on ZnO seed layer by PLD. ZnO species are adsorbed onto the ZnO nanoparticles on the SL surface. ZnO droplets migrate to the nuclei points that act as energetically favorable sites for ZnO nanostructure growth. This is due to the higher sticking coefficient of ZnO on the nuclei sites. For the ZnO crystal, the growth rates V along the normal direction of different index planes are described as: V(0001)>V(10$\bar{1}$0)>V(10$\bar{1}\bar{1}$)>V(10$\bar{1}$1)>V(000$\bar{1}$).

The presence of ZnO SL can efficiently lower the nucleation energy barrier and heterogeneous nucleation easily occurs on the SL due to the matching lattice structure and the polar nature of the PLD ZnO SL, having the benefit of increasing the nucleation sites of ZnO NWs.

What is claimed is:

1. A method for producing nanometer sized materials comprising:
    exposing a target to a laser source to remove material from the target and deposit the removed material onto a surface of a substrate to grow a thin film, as a seed layer, in the presence of oxygen at a pressure of 10 mTorr; and
    exposing the target to the laser source to remove further material from the target and deposit the further removed material onto the seed layer to grow nanometer sized materials at a pressure of between 2.5 Torr and 10 Torr in a vacuum chamber.

2. The method of claim 1, wherein the nanometer sized materials are nanowires.

3. The method of claim 1, wherein the target is zinc oxide.

4. The method of claim 1, wherein the substrate is silicon.

5. The method of claim 1, wherein the substrate is glass.

6. The method of claim 5, wherein the substrate is coated with a conductive layer.

7. The method of claim 6, wherein the conductive layer is ITO.

8. The method of claim 1, wherein the substrate is sapphire.

9. The method of claim 1, wherein the method further comprises cleaning the substrate.

10. The method of claim 9, wherein the method further comprises cleaning the substrate ultrasonically.

11. The method of claim 9, wherein the method further comprises cleaning the substrate with acetone and isopropanol.

12. The method of claim 9, wherein the method further comprises drying the substrate by compressed gas.

13. The method of claim 1, wherein the laser source is KrF excimer laser.

14. The method of claim 1, wherein the method further comprises pumping down the vacuum chamber to a base pressure of $10^{-6}$ Torr.

15. The method of claim 1, wherein the seed layer is a zinc oxide seed layer deposited onto the substrate.

16. The method of claim 1, wherein zinc oxide nanowalls are grown as the seed layer.

17. The method of claim 16, wherein the zinc oxide seed layer is grown at about 600° C.

18. The method of claim 1, wherein the nanometer sized materials are grown at a temperature lower than 500° C.

19. The method of claim 1, wherein the nanometer sized materials are grown in a background gas.

20. The method of claim 19, wherein the background gas is argon.

21. The method of claim 1, wherein the distance between the target and the source is 6.5 to 9 cm.

22. The method of claim 2, wherein a surface of the nanowires includes a nanoparticle.

23. The method of claim 2, wherein a surface of the nanowires includes a lead sulfide nanoparticle.

* * * * *